(12) United States Patent
Asmussen et al.

(10) Patent No.: US 9,732,440 B2
(45) Date of Patent: Aug. 15, 2017

(54) PROCESS AND APPARATUS FOR DIAMOND SYNTHESIS

(71) Applicants: BOARD OF TRUSTEES OF MICHIGAN STATE UNIVERSITY, East Lansing, MI (US); Fraunhofer USA, Plymouth, MI (US)

(72) Inventors: Jes Asmussen, East Lansing, MI (US); Timothy A. Grotjohn, Okemos, MI (US); Donnie K. Reinhard, East Lansing, MI (US); Rahul Ramamurti, San Ramon, CA (US); M. Kagan Yaran, Lansing, MI (US); Thomas Schuelke, Brighton, MI (US); Michael Becker, East Lansing, MI (US); David King, Lansing, MI (US)

(73) Assignees: BOARD OF TRUSTEES OF MICHIGAN STATE UNIVERSITY, East Lansing, MI (US); Fraunhofer USA, Plymouth, MI (US)

( * ) Notice: Subject to any disclaimer, the term of this patent is extended or adjusted under 35 U.S.C. 154(b) by 0 days.

(21) Appl. No.: 15/340,085

(22) Filed: Nov. 1, 2016

(65) Prior Publication Data

US 2017/0114476 A1 Apr. 27, 2017

Related U.S. Application Data

(62) Division of application No. 12/381,270, filed on Mar. 10, 2009, now Pat. No. 9,487,858.

(Continued)

(51) Int. Cl.
C30B 25/10 (2006.01)
C30B 25/12 (2006.01)
(Continued)

(52) U.S. Cl.
CPC .......... *C30B 25/105* (2013.01); *C23C 16/274* (2013.01); *C30B 25/08* (2013.01); *C30B 25/12* (2013.01); *C30B 29/04* (2013.01)

(58) Field of Classification Search
None
See application file for complete search history.

(56) References Cited

U.S. PATENT DOCUMENTS 4,507,588 A 3/1985 Asmussen et al.
5,288,327 A 2/1994 Bhat
(Continued)

OTHER PUBLICATIONS

Bustarret et al., Phys. Stat. Sol. (a) 199 (1) (2003) 9.
(Continued)

*Primary Examiner* — Guinever S Gregorio
(74) *Attorney, Agent, or Firm* — Marshall, Gerstein & Borun LLP

(57) ABSTRACT

The present invention relates to a microwave plasma deposition process and apparatus for producing diamond, preferably as single crystal diamond (SCD). The process and apparatus enables the production of multiple layers of the diamond by the use of an extending device to increase the length and the volume of a recess in a holder containing a SCD substrate as layers of diamond are deposited. The diamond is used for abrasives, cutting tools, gems, electronic substrates, heat sinks, electrochemical electrodes, windows for high power radiation and electron beams, and detectors.

11 Claims, 27 Drawing Sheets

Related U.S. Application Data

(60) Provisional application No. 61/069,200, filed on Mar. 13, 2008.

(51) Int. Cl.
  *C30B 29/04* (2006.01)
  *C30B 25/08* (2006.01)
  *C23C 16/27* (2006.01)

(56) References Cited

U.S. PATENT DOCUMENTS

| | | | |
|---|---|---|---|
| 5,311,103 A * | 5/1994 | Asmussen | C23C 16/505 118/723 R |
| 5,391,229 A | 2/1995 | Kosky et al. | |
| 5,479,875 A | 1/1996 | Tachibana et al. | |
| 5,571,577 A | 11/1996 | Zhang et al. | |
| 5,645,645 A | 7/1997 | Zhang et al. | |
| 5,820,686 A | 10/1998 | Moore | |
| 6,582,513 B1 | 6/2003 | Linares et al. | |
| 6,858,078 B2 | 2/2005 | Hemley et al. | |
| 6,858,080 B2 | 2/2005 | Linares et al. | |
| 7,115,241 B2 | 10/2006 | Hemley et al. | |
| 7,122,837 B2 | 10/2006 | Linares et al. | |
| 7,128,974 B2 | 10/2006 | Scarsbrook et al. | |
| 7,399,358 B2 * | 7/2008 | Bhandari | C30B 25/105 117/68 |
| 9,487,858 B2 | 11/2016 | Asmussen et al. | |
| 2001/0021593 A1 | 9/2001 | Sakai et al. | |
| 2002/0052124 A1 | 5/2002 | Raaijmakers et al. | |
| 2003/0106646 A1 | 6/2003 | Ma et al. | |
| 2005/0109267 A1 | 5/2005 | Linares et al. | |
| 2005/0110024 A1 | 5/2005 | Swain et al. | |
| 2005/0223992 A1 | 10/2005 | Asmussen et al. | |
| 2007/0051300 A1 | 3/2007 | Bhandari | |
| 2009/0173444 A1 | 7/2009 | Sago et al. | |

OTHER PUBLICATIONS

Funer et al., Novel microwave plasma reactor for diamond synthesis. Appl. Phys. Lett., 1998. 72 (10): p. 1149-1151.

Huang et al., Synthesis of thick, uniform, smooth ultrananocrystalline diamond films by microwave plasma-assisted chemical vapor deposition. Diamond and Related Materials, 2006. 15(2-3): p. 341-344.

Huang, W.S., Microwave plasma-assisted chemical vapor deposition of ultra-nanocrystalline diamond films, Ph.D. Thesis, Michigan State University, East Lansing: 2004.

Kahler, U., Microwave plasma diamond film growth, M.Sc. Thesis, Universitaet Gesamthochschule Wuppertal and Michigan State University, East Lansing and Wuppertal: 1997.

Khatami, S., Controlled synthesis of diamond films using a microwave discharge (non equilibrium plasma), Ph.D. Thesis, Michigan State University, East Lansing: 1997.

Kobashi, K., R&D of diamond films in the Frontier Carbon Technology Project and related topics. Diamond and Related Materials, 2003. 12(3-7): p. 233-240.

Kuo, K.P., An experimental study of high pressure synthesis of diamond films using a microwave cavity plasma reactor.

Kuo, Microwave assisted plasma CVD of diamond films using thermal-like plasma discharges, Ph.D. Thesis, State University, East Lansing: 1997.

Ramarnurti et al., "Synthesis of boron-doped homoepitaxial single crystal diamond by microwave plasma chemical vapor deposition," Diamond and Related Materials, 17, 1320-1323, 2008.

R.Ramamurti et al., "Boron doped diamond deposited by microwave plasma-assisted CVD at low and high pressures", Diamond and Related Materials, 17, 481-485, 2008.

Zuo et al., "Investigation of diamond deposition uniformity and quality for freestanding film and substrate applications", Diamond and Related Materials, 17, 300-305, 2008.

Teraji et al., Diamond Relat. Mater. 15 (2006) 602.

Tran et al., New Diamond and Frontier Carbon Technology, 2006, to be published.

Tran, Synthesis of thin and thick ultra-nanocrystalline diamond films by microwave plasma CVD, M.Sc. Thesis, Michigan State University, East Lansing: 2005.

Ulczynski et al., Ultra-High Nucleation Density for Diamond Film Growth at 470 and 900 C, in Advances in New Diamond Science and Technology, S. Saito, et al., Editors. 1994, Scientific Publishing Division of MVC: Tokyo.

Ulczynski, M.J., Thesis, Michigan State University, East Lansing: 1999.

Vikharev et al., Diamond films grown by millimeter wave plasma-assisted CVD reactor. Diamond and Related Materials, 2006. 15(4-8): p. 502-507.

Yan et al., Very high growth rate chemical vapor deposition of single-crystal diamond. Proc. Natl. Acad. Sci., 2002. 99: p. 12523-12525.

Zhang, Experimental development of microwave cavity plasma reactors for large area and high rate diamond film deposition.

* cited by examiner

*PRIOR ART*

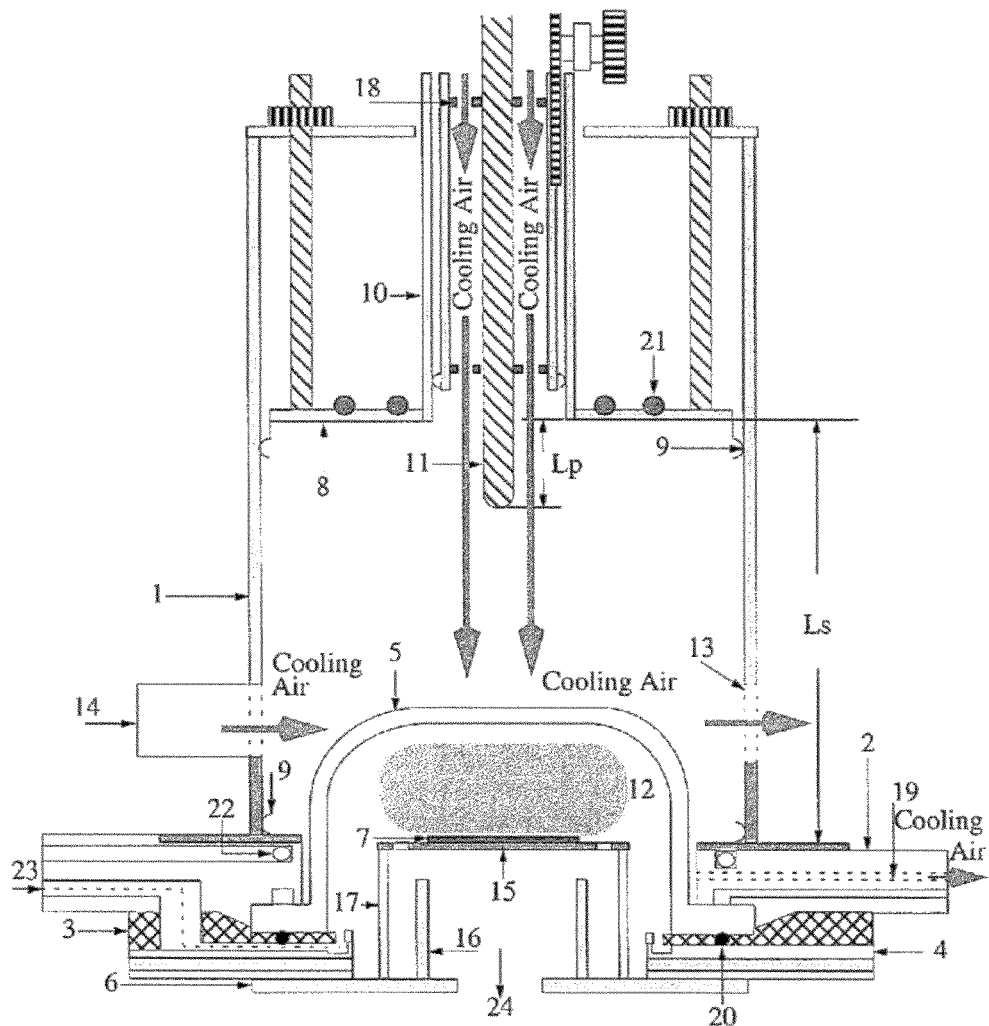

Legend
(1) Cavity Side Wall
(2) Baseplate
(3) Annular Plate
(4) Distribution Plate
(5) Quartz Dome
(6) Holder-baseplate
(7) Substrate
(8) Sliding Short
(9) Finger Stock
(10) Coaxial Waveguide
(11) Excitation Probe
(12) Plasma discharge
(13) View Window (grid)
(13) Air Blower Outlet
(14) Air Blower Inlet
(15) Flow Pattern Regulator
(15) Substrate Holder
(16) Metal Tube
(17) Quartz Tube
(18) Teflon Pieces
(19) Optical Access Port
(20) Seal O-ring
(21) Cooling Sliding Short
(22) Cooling Baseplate
(23) Gas Inlet
(24) Gas Outlet

Figure 1 Microwave cavity plasma reactor in thermally floating substrate holder configuration

PRIOR ART
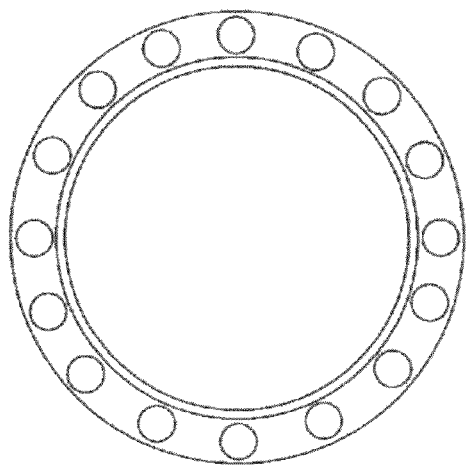
Figure 2a Top view of the substrate holder (flow pattern regulator)
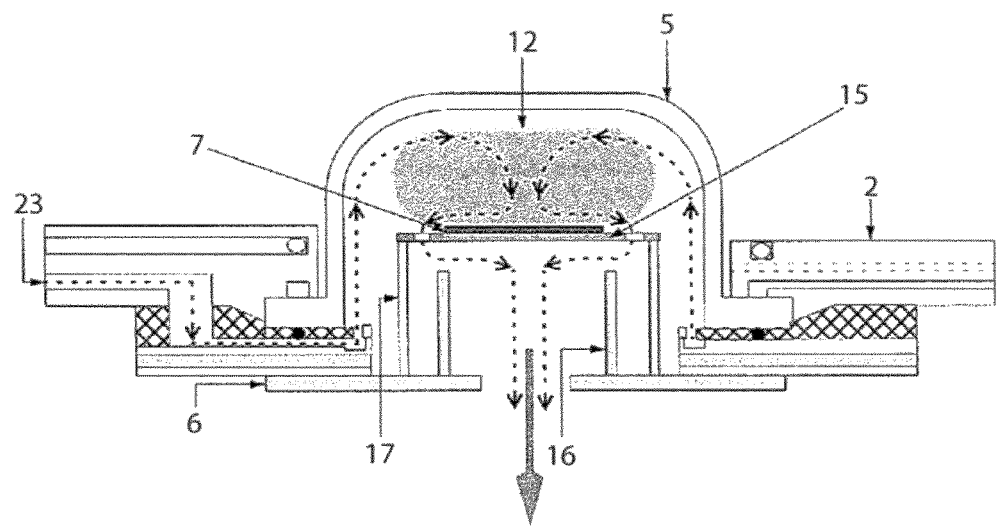
Legend
(2) Baseplate
(7) Substrate
(16) Metal Tube
(5) Quartz Dome
(12) Plasma Discharge
(17) Quartz Tube
(6) Holder Baseplate
(15) Substrate Holder
(23) Gas Inlet
Figure 2b Thermally floating substrate holder setup

*PRIOR ART*

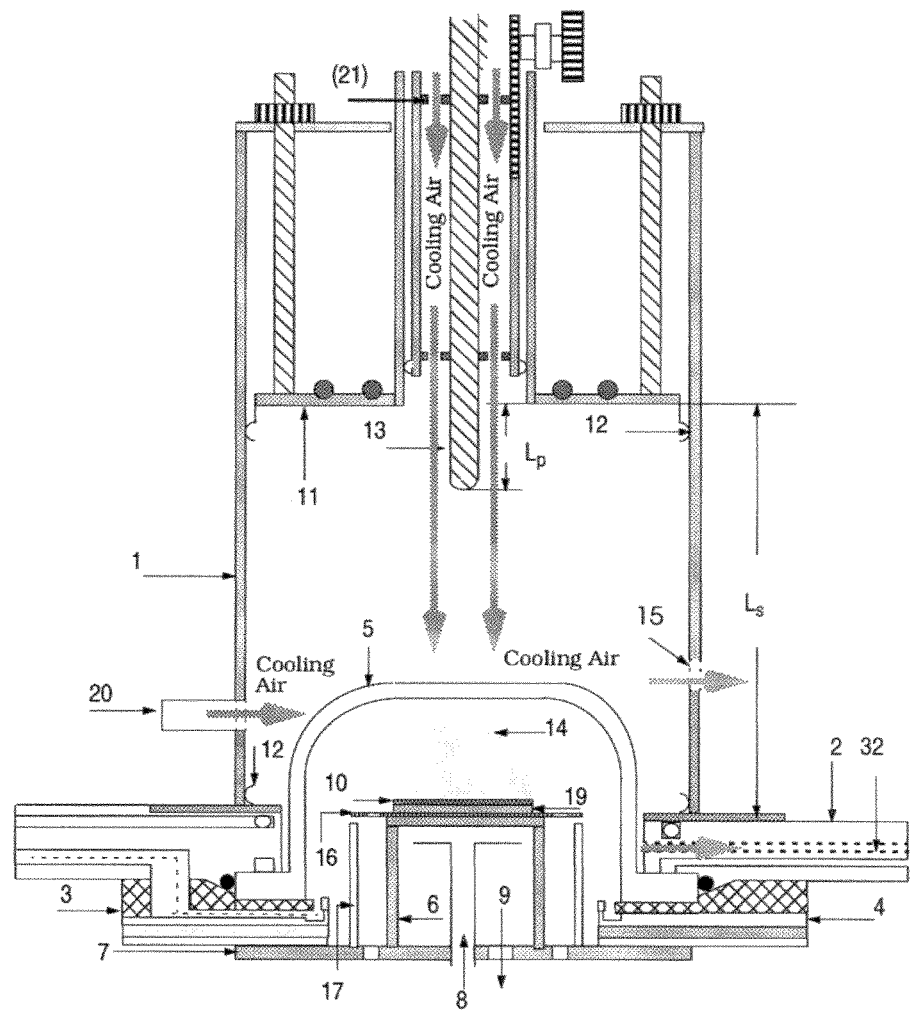

Legend
- (1) Cavity Side Wall
- (2) Baseplate
- (3) Annular Plate
- (4) Distribution Plate
- (5) Quartz Dome
- (6) Cooling Stage Wall
- (10) Substrate
- (11) Sliding Short
- (12) Finger Stock
- (13) Excitation Probe
- (14) Plasma Discharge
- (15) View Window
- (16) Flow Pattern Regulator
- (17) Quartz Tube
- (19) Insulation Disc Set
- (20) Air Blower Inlet
- (21) Teflon Pieces
- (32) Laser Ports

Figure 3 The cross sectional view of the high-pressure MCPR system shown operating with cooling stage configuration

PRIOR ART

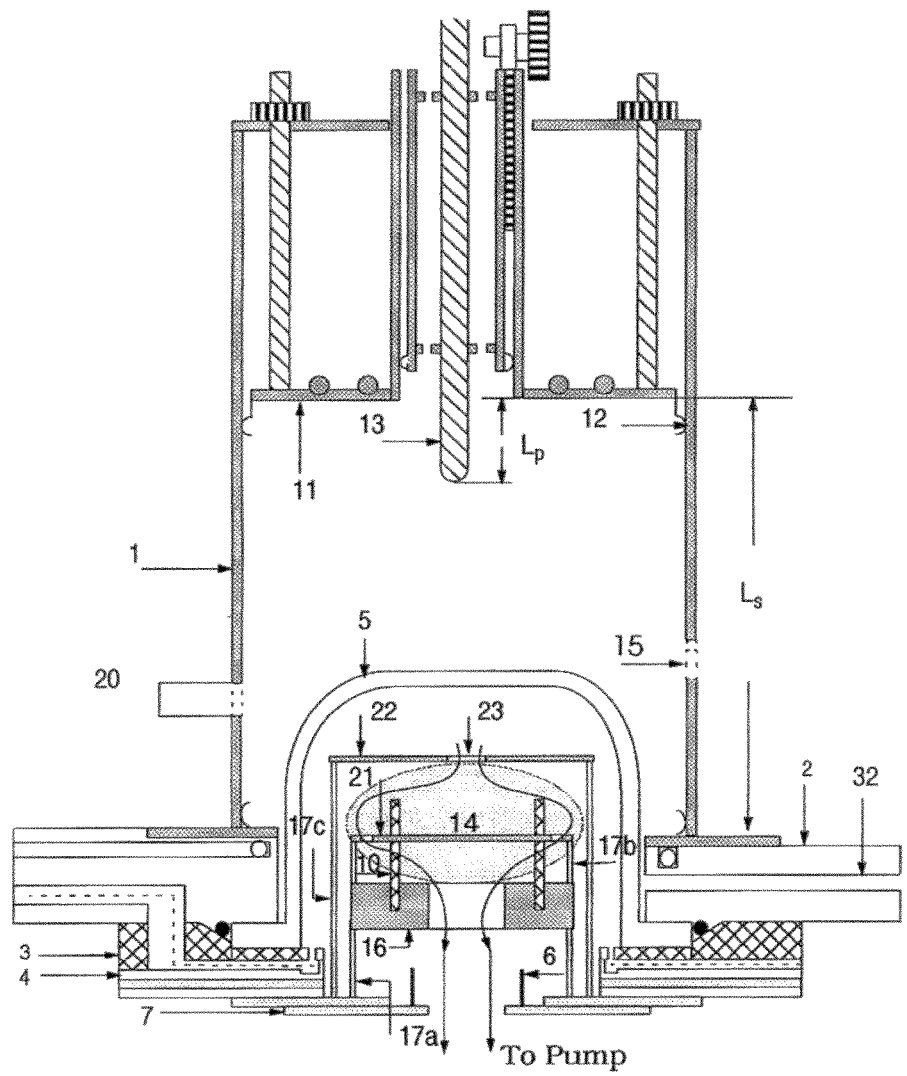

Legend

| (1) | Cavity Walls | (2) | Baseplate | (3) | Gas Annular Plate |
| (4) | Gas Distribution Plate | (5) | Quartz Bell Jar | (6) | Resonant Breaker |
| (7) | Metal Stage | (10) | Substrate | (14) | Plasma Discharge |
| (16) | Substrate Holder | (17a) | 10mm Quartz Tube | (17b) | 77mm Quartz Tube |
| (22) | Jet Nozzle Plate | (23) | Jet Nozzle | (32) | Laser Ports |

Figure 4 The cross sectional view of the final optimized configuration for diamond film coating on eighteen and thirty six WC-6%Co round tools

PRIOR ART

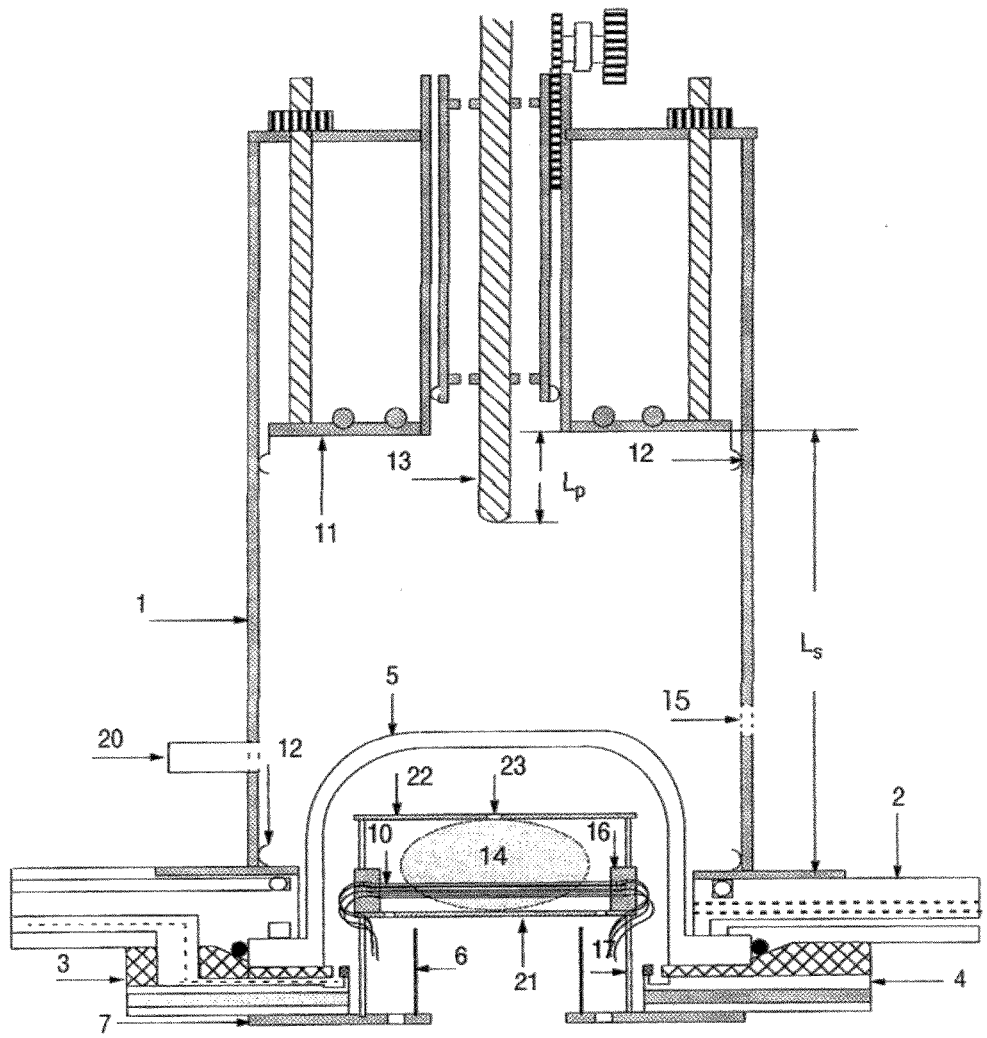

Legend

| (1) | Cavity Side Wall | (2) | Baseplate | (3) | Annular Gas Plate |
| (4) | Gas Distribution Plate | (5) | Quartz Dome | (6) | Resonant Breaker |
| (7) | Metal Stage | (10) | Carbon Fiber Substrate | (11) | Sliding Short |
| (12) | Finger Stock | (13) | Excitation Probe | (14) | Plasma Discharge |
| (15) | Screen Side View | (16) | Substrate Holder | (17) | Quartz Tube |
| (21) | Shielding Plate | (22) | Jet Nozzle Plate | (23) | Jet Nozzle |
| (32) | Laser Ports | | | | |

Figure 5 The cross sectional view of the microwave plasma jet reactor for diamond thin film coating on carbon fibers

*PRIOR ART*
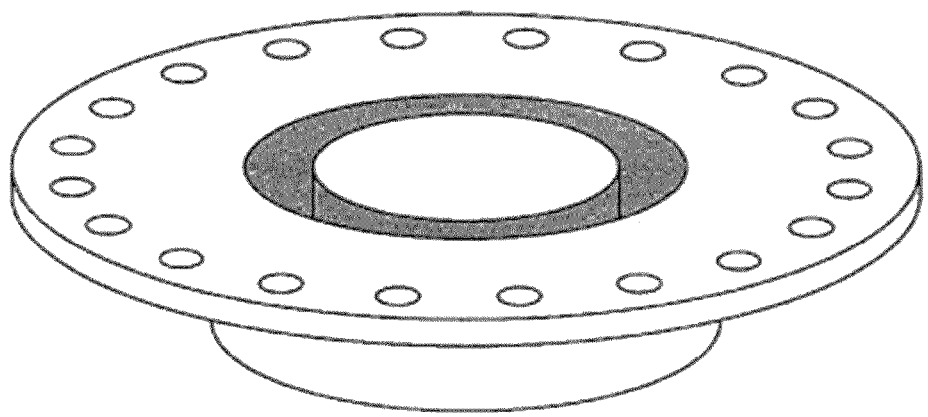
Figure 6a Top view of the seal substrate holder.
A SiC seal was inserted into the grey area.
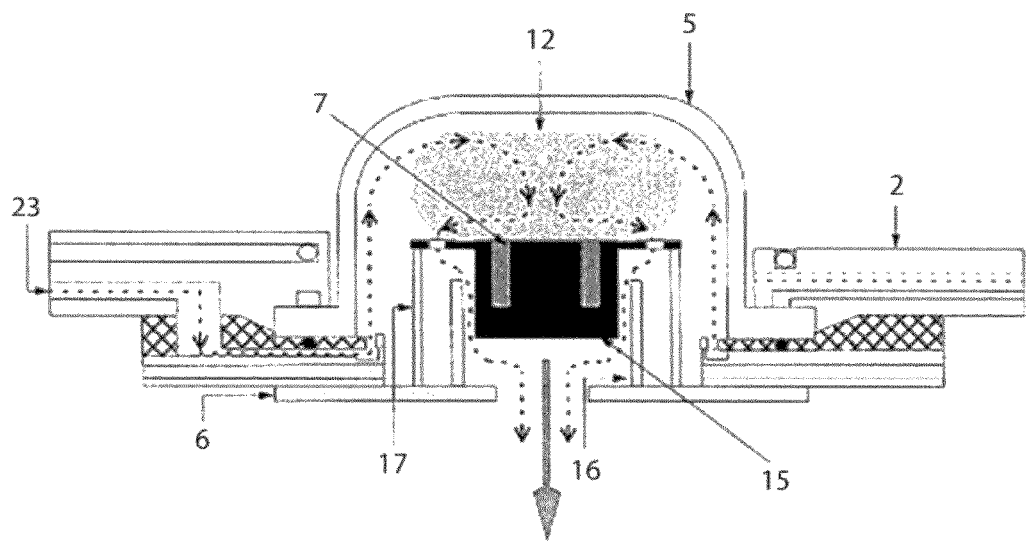
Legend
(2) Baseplate
(7) Substrate (SiC Seal)
(16) Metal Tube
(5) Quartz Dome
(12) Plasma Discharge
(17) Quartz Tube
(6) Holder Baseplate
(15) Substrate Holder
(23) Gas Inlet
Figure 6b Seal coating substrate holder setup PRIOR ART
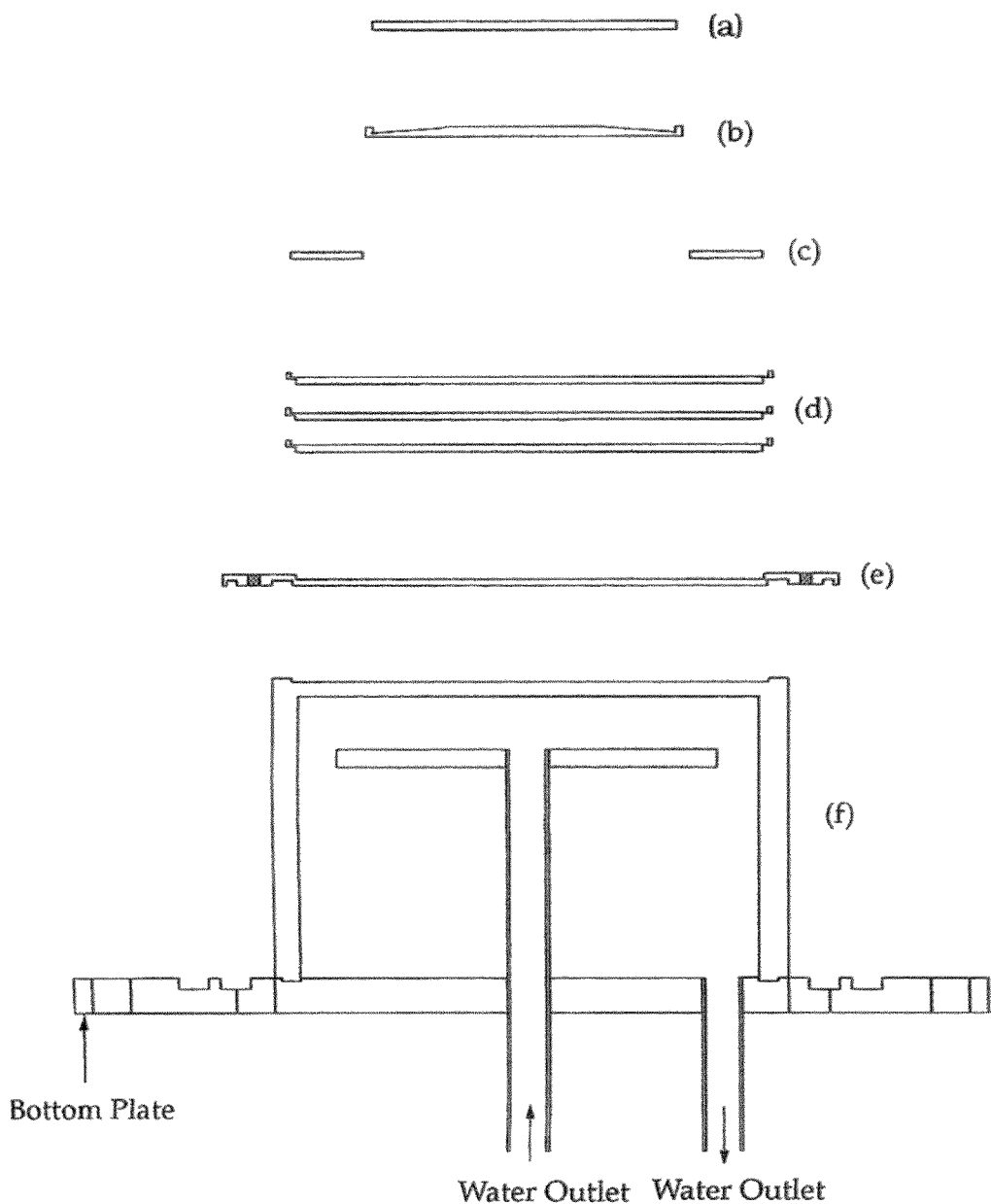
Figure 7 Typical substrate holder setup used in high-pressure MCPR for diamond film deposition: (a) 2" Si wafer, (b) 2" Mo substrate holder, (c) Mo ring, (d) Mo discs, (e) Mo gas flow regulator, (f) water cooling stage

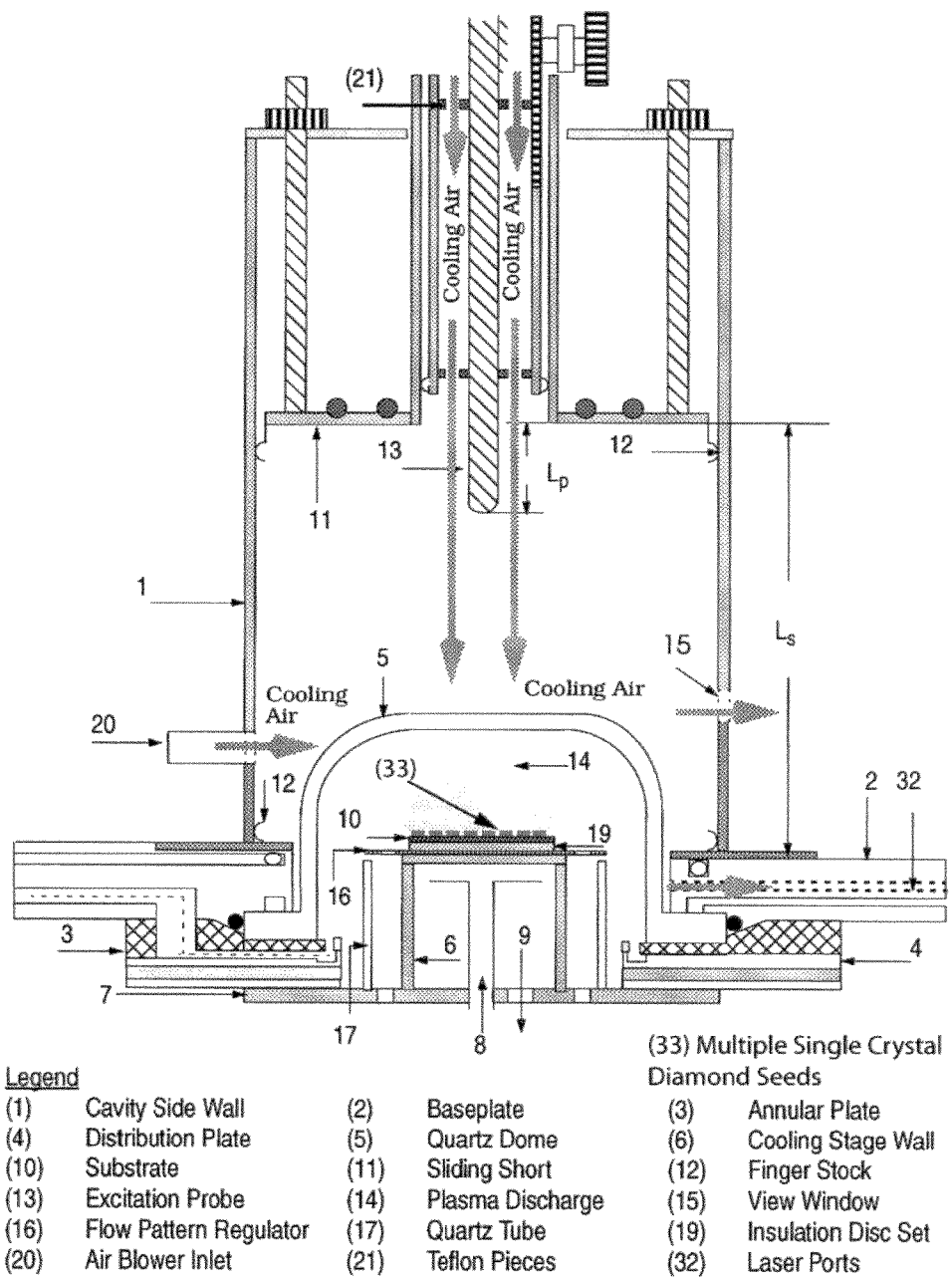
Figure 8 Multiple single crystal diamond substrates MCPR configuration

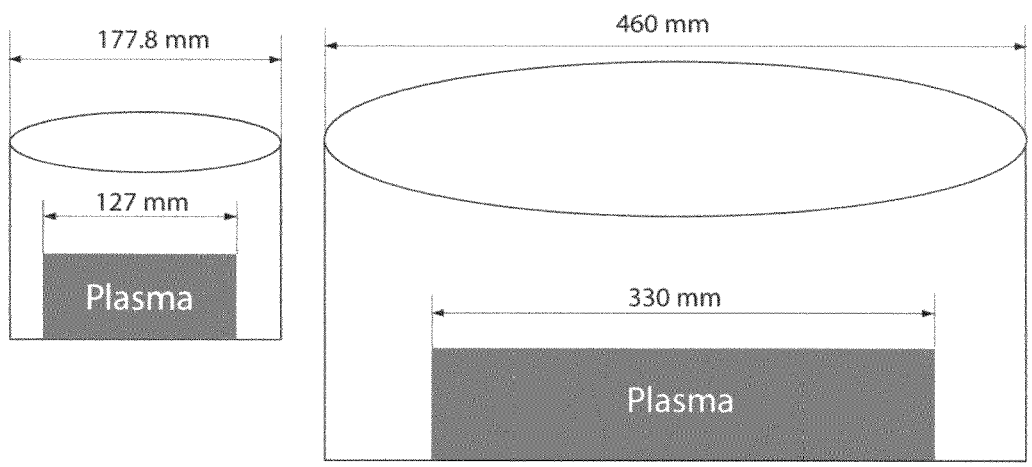
Figure 9 Reactor scaling with microwave frequency (left 2.45GHz, right 915 MHz)

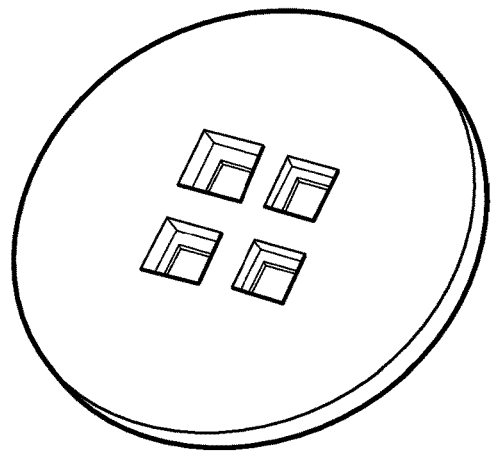
Figure 14 Isometric view of an exemplary holder design with recess positions
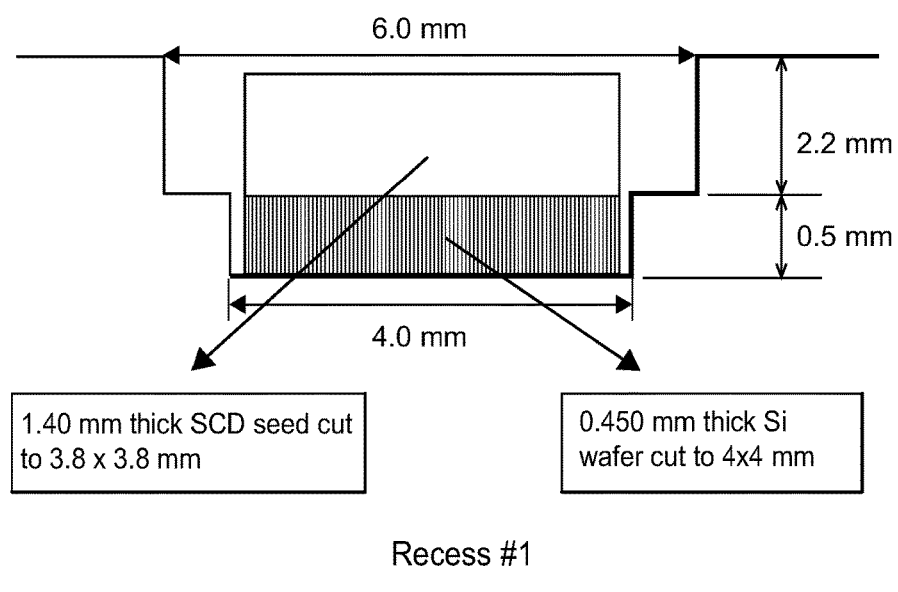
Recess #1
Figure 14A

Recess #1

Recess #2

Recess #3

Recess #4

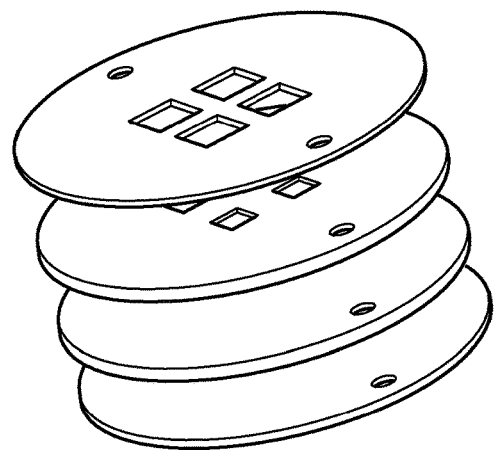
Figure 15 Isometric view of an exemplary holder design with recesses and a plurality of discs
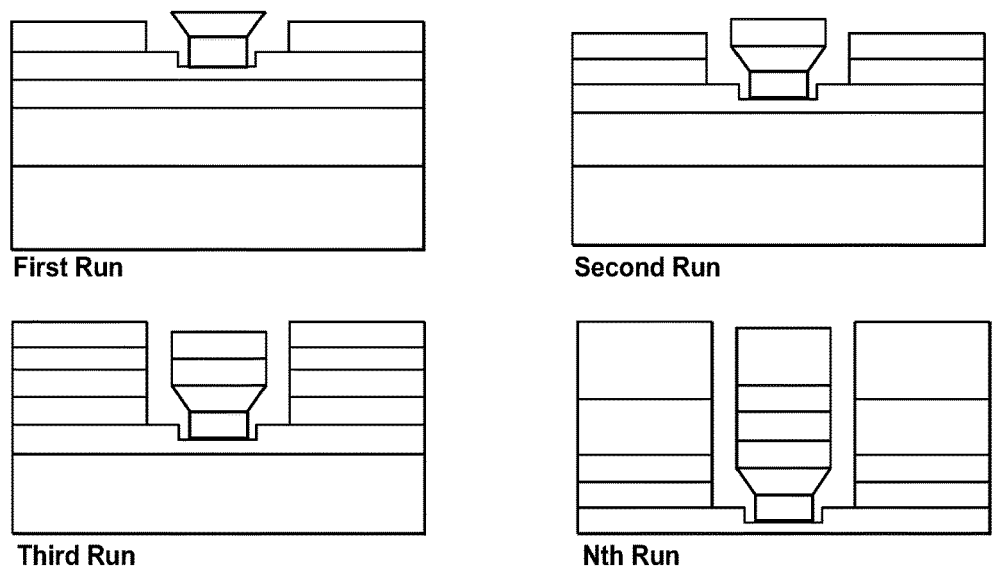
Figure 16 Order of the diamond growth process shown schematically

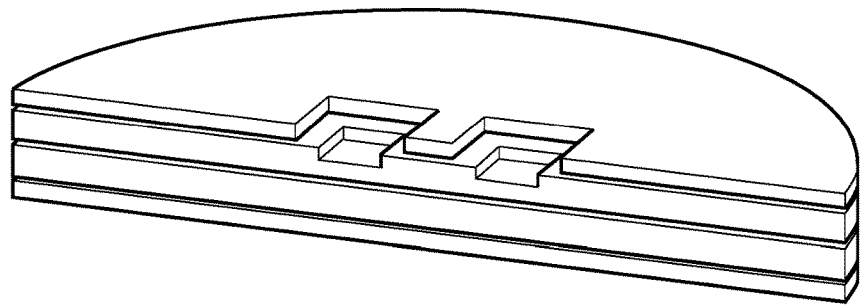
Figure 17 Molybdenum holder structure for new SCD samples
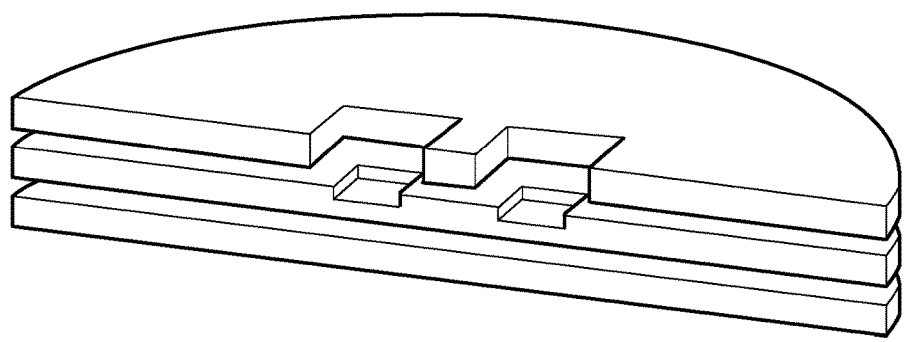
Figure 18 Molybdenum holder structure for previously grown SCD samples

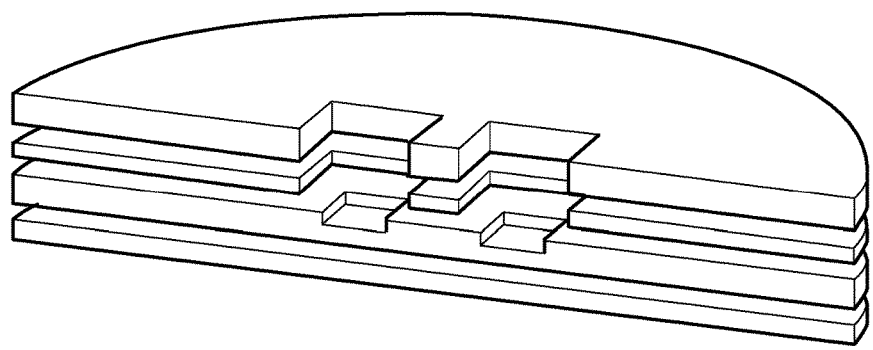
Figure 19 Molybdenum holder structure for previously grown SCD samples
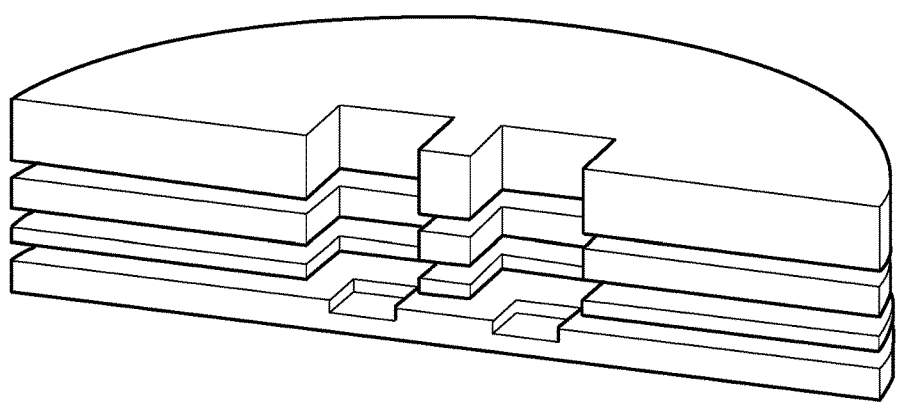
Figure 20 Molybdenum holder structure for previously grown SCD samples Position of 4 samples on an exemplary 4" substrate holder

Figure 22
Influence of Nitrogen
| SCD#DK001 | SCD#DK002 |
|---|---|
| 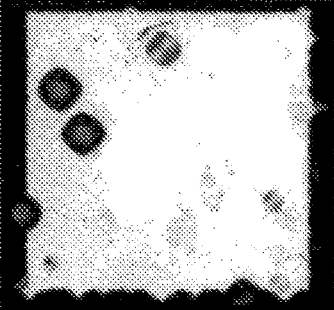 | 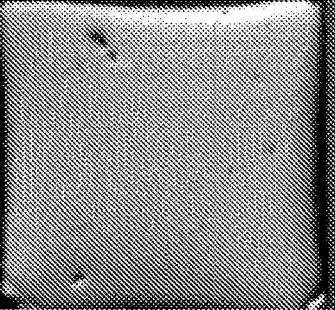 |
| Without $N_2$ growth rate of 5.33 microns per hour achieved | With 175 ppm $N_2$ growth rate of 16.07 microns per hour achieved |
Figure 23
Repeatability
| SCD#DK003 | SCD#DK004 |
|---|---|
| 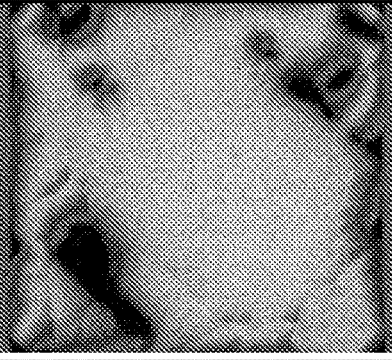 | 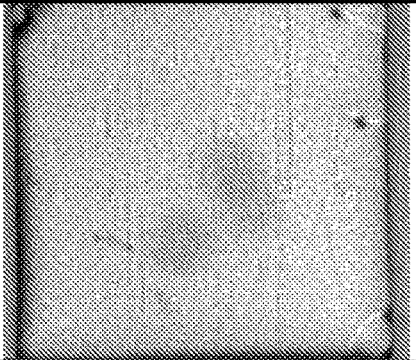 |
| With 300 ppm $N_2$ at 40 sccm Producing a growth rate of 20.39 microns per hour | With 300 ppm $N_2$ at 40 sccm Producing a growth rate of 18.39 microns per hour |

Figure 24
More nitrogen decreases defects
| SCD#DK005 | SCD#DK006 |
|---|---|
| 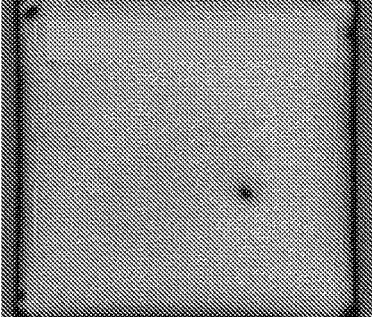 | 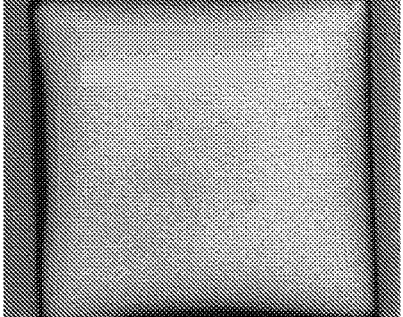 |
| Without 400 ppm N$_2$ at 24 sccm, growth rate of 19.54 microns per hour | Without 400 ppm N$_2$ at 24 sccm, growth rate of 17.88 microns per hour |

Surface of Si wafer (R = 8 ohms) (1500x)    Surface of Si wafer (R = 8 ohms) (5000x)

First data of boron-doped diamond coated on single crystal substrate 25x                100x                500x

Figure 28C

| | | | 537<br>14.1 | 537<br>15.0 | | | | |
|---|---|---|---|---|---|---|---|---|
| | 553<br>14.6 | 631<br>16.6 | 631<br>16.6 | 667<br>17.5 | 667<br>17.5 | 648<br>17.1 | 770<br>20.3 | |
| | 579<br>15.2 | 664<br>17.5 | 697<br>18.3 | 697<br>18.0 | 710<br>18.7 | 737<br>19.4 | 681<br>17.9 | 679<br>17.9 |
| | 606<br>16.0 | 701<br>18.5 | 732<br>19.3 | 732<br>19.2 | 799<br>21.0 | 758<br>19.9 | 773<br>20.4 | 665<br>17.5 |
| | 632<br>16.6 | 654<br>17.2 | 736<br>19.4 | 736<br>22.1 | 841<br>22.1 | 766<br>20.2 | 784<br>20.6 | 641<br>16.9 |
| | 638<br>16.8 | 672<br>17.7 | 765<br>20.1 | 765<br>20.3 | 789<br>20.8 | 812<br>21.4 | 756<br>19.9 | 730<br>19.2 |
| | 602<br>15.8 | 659<br>17.4 | 709<br>18.7 | 709<br>20.7 | 774<br>20.4 | 769<br>20.0 | 751<br>19.8 | 701<br>18.5 |
| | 565<br>14.9 | 636<br>16.8 | 705<br>18.5 | 705<br>18.2 | 713<br>18.8 | 687<br>18.1 | 659<br>17.4 | 658<br>17.3 |
| | 597<br>15.7 | 609<br>16.0 | 609<br>16.5 | 640<br>16.9 | 638<br>16.8 | | 516<br>16.2 | |
| | 480<br>12.6 | 480<br>15.3 | 605<br>15.9 | 579<br>15.3 | 560<br>14.7 | 516<br>13.6 | | |

Figure 28D

| | | 1155<br>14.1 | 1156<br>15.0 | | | | |
| --- | --- | --- | --- | --- | --- | --- | --- |
| | 1167<br>14.6 | 1172<br>16.6 | 1159<br>16.6 | 1166<br>17.5 | 1138<br>17.5 | 1125<br>17.1 | 1096<br>20.3 |
| 1167<br>15.2 | 1193<br>17.5 | 1174<br>18.3 | 1159<br>18.0 | 1161<br>18.7 | 1169<br>19.4 | 1141<br>17.9 | 1139<br>17.9 |
| 1174<br>16.0 | 1181<br>18.5 | 1196<br>19.3 | 1178<br>19.2 | 1178<br>21.0 | 1171<br>19.9 | 1166<br>20.4 | 1137<br>17.5 |
| 1158<br>16.6 | 1153<br>17.2 | 1173<br>19.4 | 1190<br>20.6 | 1197<br>22.1 | 1194<br>20.2 | 1173<br>20.6 | 1163<br>16.9 |
| 1145<br>16.8 | 1161<br>17.7 | 1166<br>20.1 | 1188<br>20.3 | 1181<br>20.8 | 1190<br>21.4 | 1183<br>19.9 | 1162<br>19.2 |
| 1135<br>15.8 | 1148<br>17.4 | 1160<br>18.7 | 1161<br>20.7 | 1171<br>20.4 | 1175<br>20.0 | 1175<br>19.8 | 1180<br>18.5 |
| 1120<br>14.9 | 1139<br>16.8 | 1149<br>18.5 | 1158<br>18.2 | 1166<br>18.8 | 1172<br>18.1 | 1178<br>17.4 | 1190<br>17.3 |
| | 1130<br>15.7 | 1138<br>16.0 | 1152<br>16.5 | 1165<br>16.9 | 1165<br>16.8 | | 1202<br>16.2 |
| 1130<br>12.6 | 1139<br>15.3 | 1159<br>15.9 | 1170<br>15.3 | | 1193<br>14.7 | 1207<br>13.6 | |

PROCESS AND APPARATUS FOR DIAMOND SYNTHESIS

CROSS REFERENCE TO RELATED APPLICATIONS

This application is a division of U.S. patent application Ser. No. 12/381,270 filed Mar. 10, 2009 (incorporated herein by reference in its entirety), which in turn claims priority to U.S. Provisional Application No. 61/069,200 (filed on Mar. 13, 2008).

STATEMENT REGARDING FEDERALLY SPONSORED RESEARCH OR DEVELOPMENT

Not Applicable.

REFERENCE TO A "COMPUTER LISTING APPENDIX SUBMITTED ON A COMPACT DISC"

Not Applicable.

BACKGROUND OF THE INVENTION (1) Field of the Disclosure

The present invention relates generally to an apparatus and a process for synthesizing diamond, preferably single crystal diamond (SCD) by Microwave Plasma Assisted Chemical Vapor Deposition (MPCVD).

(2) Description of the Related Art

Microwave Cavity Plasma Reactors (MCPR) designs are typically able to achieve relatively high deposition rates and deposition uniformity. MCPR's have been applied to many different diamond synthesis applications. (See e.g., Zhang, J., *Experimental development of microwave cavity plasma reactors for large area and high rate diamond film deposition*; Kuo, K. P., *Microwave assisted plasma CVD of diamond films using thermal-like plasma discharges*, Ph.D. Thesis, Michigan State University, East Lansing: 1997; Ulczynski, M. J., Thesis, Michigan State University, East Lansing: 1999; Huang, W. S., *Microwave plasma-assisted chemical vapor deposition of ultra-nanocrystalline diamond films*, Ph.D. Thesis, Michigan State University, East Lansing: 2004; Khatami, S., *Controlled synthesis of diamond films using a microwave discharge (non equilibrium plasma)*, Ph.D Thesis, Michigan State University, East Lansing: 1997; Kehler, U., *Microwave plasma diamond film growth*, M. Sc. Thesis, Universitaet Gesamthochschule Wuppertal and Michigan State University, East Lansing and Wuppertal: 1997) 40-44] and U.S. Pat. Nos. 4,507,588, 5,311,103.) A cross sectional view of this reactor is shown in FIG. 1.

According to FIG. 1, a microwave plasma reactor creates a hemisphere-shaped plasma in close contact with the substrate and thus allows the coating of a large substrate surface. For example, using 2.45 GHz excitation, diamond films can uniformly be deposited over three to four inch diameter (80 cm$^2$) substrates, and when excited with 915 MHz the substrate deposition diameter can be scaled to over eight inches and deposition areas can exceed 320 cm$^2$. Additionally this reactor concept is also operationally versatile. It can be adjusted to deposit diamond over a wide range of experimental conditions; i.e. it can deposit diamond on a variety of substrates, at pressures of 0.5-200 Torr, with variable power levels of (i) 500 W-6 kW at 2.45 GHz and (ii) 3 kW-20 kW at 915 MHz.

FIG. 1 shows a cross sectional view of a typical microwave cavity plasma reactor configured for operation in the "thermally floating substrate" mode. As shown, the cavity applicator sidewall (1) is made of a cylindrical brass tube. This brass tube forms the outer conducting shell of the cavity applicator and is electrically shorted to a water-cooled baseplate assembly (2-4) and a water-cooled (21) sliding short (8) via finger stock (9). Thus the cylindrical volume bounded by the sliding short, the cavity applicator sidewall and the substrate holder/baseplate form the cavity applicator electromagnetic excitation region. Continuous wave (CW) microwave power, typically at 2.45 GHz, is coupled into the cylindrical cavity applicator through a mechanically tunable coaxial excitation probe (11). This probe is the center conductor of the coaxial waveguide (10), which, as shown in FIG. 1, is attached to the center of the sliding short (8). The movement of the sliding short changes the applicator length, $L_s$, while the variation of the coaxial probe (10) position adjusts the depth of penetration of the coaxial excitation probe, $L_p$, inside the cavity applicator. Both $L_s$ and $L_p$ can be independently varied up and down along the longitudinal axis of the applicator and both are adjusted: (i) to select the desired electromagnetic mode (primarily achieved by adjusting the length, $L_s$) and then (ii) couple microwave energy into the desired electromagnetic mode (primarily a probe depth adjustment) and (iii) to optimally match (achieved by iteratively but slightly adjusting both the probe and the short) the reactor to the input microwave system.

Transverse magnetic TM013 electromagnetic mode is used to establish the plasma discharge and is excited inside the cavity applicator by applying 2.45 GHz microwave power and length and probe tuning of the applicator to ignition conditions. For example, for an applicator with an inner diameter of 17.8 cm, the sliding short and probe lengths are adjusted to about $L_s$=21.7 cm and $L_p$=3.2 cm respectively. When approximately 20-50 W of microwave energy is coupled into the applicator and the reactor pressure is reduced to approximately 1-10 Torr, a discharge can be ignited inside the quartz dome. Then as the reactor system and discharge are brought up to the desired steady-state diamond deposition pressure, power and flow rate conditions, the applicator length, $L_s$, and the probe depth, $L_p$, are iteratively adjusted to reduce the reflected power and to achieve the desired process results such as deposition uniformity. It has been determined experimentally that the discharge loaded TM013 mode produces an axi-symmetric ellipsoid-like discharge, which is in good contact with the substrate.

The baseplate assembly consists of a water-cooled (22) and air-cooled (19) baseplate (2), an annular input gas feed plate (3) and a gas distribution plate (4). A quartz dome (5) with an inside diameter of 12.5 cm is sealed by an O-ring (20) in contact with the baseplate assembly. The thermally floating substrate holder cross section shown in FIG. 1 includes a flow pattern regulator (15), a metal tube (16), a quartz tube (17) and a holder-baseplate (6). The premixed input gases are fed into the gas inlet (23) in the baseplate assembly. The substrate (7) is placed on top of a molybdenum substrate holder (15), which is supported by the quartz tube (17). Quartz tubes of different heights may be used to change the position of the substrate with respect to the plasma to optimize (i.e. improve the uniformity, increase deposition rates, etc.) the film deposition process. The molybdenum holder (15), shown in greater detail in FIG. 2, also serves as a gas flow pattern regulator.

According to FIGS. 2(a-b), a cylindrical metal tube (16) is placed concentrically inside the quartz tube. This metal tube prevents a discharge from forming underneath the substrate by reducing the electric field underneath the substrate. The metal tube (16) and the quartz tube (17) are placed on the holder baseplate (6). This holder baseplate has a 3 cm diameter hole cut in its center that allows the gases (24) to exit out of the reactor and then are pumped out of the vacuum system. The baseplate assembly (2-4), i.e. in particular the annular input gas feed plate (3), and the gas distribution plate (4), introduce an uniform ring of input gases that flow into the low pressure region inside the quartz dome. The TM013 electromagnetic fields are also focused into this region and ignite and sustain the microwave discharge (12) over the substrate (7). Air-cooling of the reactor is carried out by forcing air (or nitrogen gas) into the reactor through inlets (14) and (18), onto the dome and the interior cavity walls and then out through the screened window (13), and the optical access ports (19).

The thermally floating substrate holder configuration shown in FIGS. 2(a-b) utilizes a flow pattern regulator. The objective of this regulator is to spatially control the gas flows within the quartz dome to produce a flat, uniform, disk-shaped discharge hovering over and above and in good contact with the substrate. It consists of a specially designed molybdenum substrate plate (15) with a series of holes located around its outer circumference. This holder was developed to increase the uniformity of the film deposition by changing the gas flow patterns within the reactor and especially within the discharge. The gas flows circulating within the quartz dome are directed by the flow pattern regulator to flow around and through the discharge and thereby alter the shape and position of the discharge.

Screened windows (13) are cut into the cavity wall for viewing the discharge. These windows were also used for substrate temperature measurement. A topside substrate temperature measurement can be performed by focusing the pyrometer through the window onto the substrate. When the spot size of the pyrometer is reduced to 2 mm, temperature uniformity can be measured over two to three inch diameter silicon substrates (See e.g., Kuo, K. P., *An experimental study of high pressure synthesis of diamond films using a microwave cavity plasma reactor*; Kuo, K. P., *Microwave assisted plasma CVD of diamond films using thermal-like plasma discharges*; S. S. Zuo, M. K. Yaran, T. A. Grotjohn, D. K. Reinhard, and J. Asmussen, "Investigation of diamond deposition uniformity and quality for freestanding film and substrate applications", Diamond and Related Materials, 17, 300-305, 2008.) Other process measurements, such as quartz dome temperature and plasma optical emission measurements also can be preformed through these screened windows.

As discussed in U.S. Pat. No. 5,311,103, several features of the Microwave Cavity Plasma Reactor are responsible for its operational versatility including: (i) independently adjustable (tunable end plate) sliding short, (ii) coupling probe, and (iii) an axially adjustable stage that supports the substrate. The sliding short and coupling probe adjustments allow the reactor to excite the discharge with the desired electromagnetic mode and also to achieve a microwave power match over a large operational (pressure and power) regime. These two adjustments together with the independent adjustment of the substrate position also enable the positioning of the discharge above and in contact with the substrate. A hemispherical or disk shaped plasma is formed over the substrate and thereby creates the conditions for large area uniform deposition and also allows a degree of substrate temperature control. In addition to smooth substrates like silicon wafers irregular shaped and multiple substrates such as inserts and tool bits can be coated.

The versatility of this reactor concept also includes the ability to specifically engineer the substrate holder configuration to a specific deposition task. Given a specific CVD deposition/synthesis application the substrate holder configuration is redesigned and modified to achieve the goals of the application. For example, when operating in the higher pressures regime (80-200 Torr) a cooling stage is added. (See e.g., FIG. 3.) Thus in this higher pressure operating regime the substrate temperature can be controlled (lowered) to be within the desirable substrate temperature diamond deposition regime; i.e. between 500-1400° C. Other examples of specially engineered substrate holders include: (i) examples given in U.S. Pat. Nos. 4,507,588, 5,311,103, 5,571,577, and 5,645,645; and the substrate assemblies designed for depositing polycrystalline diamond films on (ii) glass (See e.g. Ulczynski, M. J., *Thesis, Michigan State University, East Lansing:* 1999; and Ulczynski, M. J., et al., *Ultra-High Nucleation Density for Diamond Film Growth at 470 and 900 C, in Advances in New Diamond Science and Technology*, S. Saito, et al., Editors. 1994, *Scientific Publishing Division of MVC*: Tokyo); (iii) round tools as shown in FIG. 4; (iv) carbon fibers as shown in FIG. 5; (v) ring seals as shown in FIGS. 6 (a-b); and the synthesis of (vi) ultrananocrystalline diamond film deposition. (See e.g., Huang, W. S., *Microwave plasma-assisted chemical vapor deposition of ultra-nanocrystalline diamond films*, Ph.D. Thesis, Michigan State University, East Lansing: 2004; Huang, W. S., et al., *Synthesis of thick, uniform, smooth ultrananocrystalline diamond films by microwave plasma-assisted chemical vapor deposition. Diamond and Related Materials*, 2006. 15(2-3): p. 341-344; Tran, D. T, *Synthesis of thin and thick ultra-nanocrystalline diamond ilms by microwave plasma CVD*, M. Sc. Thesis, Michigan State University, East Lansing: 2005; and Tran, D. T., et al., *New Diamond and Frontier Carbon Technology*, 2006, to be published.) In each of these example deposition applications a special substrate holder configuration was designed and was inserted into the reactor.

As previously described, when the operating pressure is increased to above about 90 Torr the substrate temperature can exceed the temperature that is allowed for diamond deposition. The substrate must then be cooled. Hence the substrate holder configuration shown in FIG. 1 must be changed from the thermally floating configuration to the cooled configuration shown in FIG. 3 and in greater detail in FIG. 7.

The water-cooled substrate holder configuration consists of a cylindrical, metallic, water-cooled stage attached to the holder-baseplate (7). As shown in FIG. 3 and FIG. 7 cooling water flows into (8) and out (9) of this stage keeping the stage at a low temperature. The molybdenum flow pattern regulator is placed on top of and is in good thermal contact with the cooling stage. A set of molybdenum insulation disks (d) are inserted between the flow pattern regulator and the substrate (10 or a) and thereby enable the variation of the substrate temperature. Gas flow patterns are similar to the gas flows shown in FIGS. 2(a-b) for the thermally floating configuration. Thus the quartz tube (17) serves the same purpose for both configurations; i.e. it helps direct the gases to flow through and around the discharge, through the gas flow regulator and then exit the reactor into the vacuum system. Additional substrate temperature control is achieved by placing several disk shaped molybdenum inserts (see (d) in FIG. 7) between the substrate and the substrate cooling stage. For example, at a constant operating pressure substrate temperature variation is achieved by varying the number and thicknesses of the molybdenum disks that are placed between the substrate and the water-cooled stage. It is noted here that as the number and thicknesses of the molybdenum inserts are changed the substrate position and the sliding short positions also may have to be varied slightly in order to achieve the optimum substrate temperature and deposition uniformity. Additionally, it was determined that by varying the pressure, substrate temperatures, and input gas mixtures, i.e. $CH_4/H_2$ and $N_2/H_2$ ratios, the growth $\alpha$-parameters varies, thereby adjusting the horizontal and vertical growth ratio on each diamond crystal (Jes Asmussen and D. K. Reinhard, Diamond Films Handbook, Marcel Dekker, pp. 252, 2002). Thus process optimization becomes an iterative process where the sliding short, the coupling probe, the substrate position and the substrate configuration, i.e. the number and thicknesses of the molybdenum inserts, are all adjusted for optimum deposition conditions.

Initially the microwave cavity reactor was experimentally evaluated in a variety of diamond synthesis applications over a low-pressure regime of 20-80 Torr. Using the thermally floating configuration uniform deposition was achieved over three and four-inch (80 $cm^2$) substrates with linear, polycrystalline diamond deposition rates as high as 0.7 micron per hour. Discharge power densities were as high as 10 $W/cm^3$. Although large area uniform deposition was achieved the low linear deposition rates were similar to the earlier experimental results, which employed the tubular reactor.

In an effort to increase the deposition rates the microwave cavity reactor was experimentally evaluated over a higher-pressure 80-160 Torr regime. In this pressure regime the microwave discharge becomes a high power density discharge. As pressure increases the discharge size decreases and the absorbed power density increases to 30-45 $W/cm^3$. A thermal like discharge is created and neutral gas temperatures are 2500 K to over 3000 K. As described above and shown in FIG. 3, a water cooled substrate holder stage is added to enable the adjustment of the substrate temperate within the diamond deposition regime. Under these conditions, thick, two-inch diameter, uniform (better than 15%) diamond films were synthesized. For example, two-inch diameter polycrystalline disks with uniformities of 10% and with thicknesses greater than 600 microns were grown. Recently, high quality, uniform (+/−5%) polycrystalline diamond deposition over three inch diameter silicon substrates was examined. When operating in the higher-pressure regime (100-160 Torr) uniform deposition rates were as high as 4.5-7 microns per hour. These rates are eight to ten times higher than the rates at lower pressure operation. If uniformity is not a concern, i.e. if high rate deposition over smaller areas is desired then deposition rates of over 10 microns per hour are possible. Accordingly, these experiments demonstrated that by increasing the operating pressure to 100-200 Torr a high power density microwave discharge is created. This discharge produces very high radical densities, such as atomic hydrogen and carbon radicals, which are important for rapid diamond synthesis. The densities of these radical species increase with increasing pressure.

The MPCR and the associated high pressure microwave discharge can be controlled to produce high quality, uniform, thick polycrystalline films over two and three inch substrates. These experiments demonstrated that the high-pressure operation together with the associated high power density microwave discharge and the high radical species densities causes a substantial increase in polycrystalline diamond deposition rates. These results may suggest suitable commercial potential for microwave CVD diamond synthesis.

Controlled and uniform, high pressure (100-200 Torr), microwave plasma assisted CVD polycrystalline diamond synthesis was achieved by introducing a number of innovations: (i) cooling the substrate holder; (ii) the introduction of molybdenum holder inserts and the associated shaping and holding of the substrate; (iii) the reduction of the spot size for the substrate temperature measurement to about 2 mm and then during the deposition process the in-situ, online monitoring and the controlling of the substrate temperature uniformity (to less than 50 K); (iv) the adjustment of the spatial neutral gas flows within the reactor and through the discharge to improve deposition uniformity; and (v) the positioning and the controlling of the shape of the discharge so that it becomes a hemisphere-shaped plasma that hovers over and is in good contact with the substrate.

A typical process cycle includes several steps: (i) discharge ignition; (ii) pre-deposition plasma surface treatments; (iii) adjustment of the operating conditions to the desired process conditions, i.e. pressure, gas flow rates, substrate temperature and temperature uniformity, etc.; (iv) steady-state operation; (v) post-deposition plasma surface treatments; and (vi) process shut down. Discharge ignition is achieved by first adjusting the cavity applicator sliding short to a length position so that the empty cavity TM013 mode (or any TM01n) electromagnetic mode is excited within the cavity and then also by adjusting the probe depth to enable the coupling of microwave energy into the cavity applicator. For a typical 17.8 cm diameter cavity applicator the initial sliding short length for TM013 mode excitation is about 21.6 cm and the initial coupling probe depth is approximately 3.2 cm. The discharge is ignited by adjusting the pressure to about 1-20 Torr (depending on the filling gas), and then by increasing the incident microwave power and finally by coupling this power, via the adjustment of the probe and sliding short, into the applicator. After discharge ignition, the cavity applicator may have to be further adjusted by tuning the sliding short and the coupling probe so that the incident microwave energy is matched (coupled) into the cavity applicator. Once the microwave discharge is created the operating pressure is increased to the desired process conditions, which are typically between 100-200 Torr, 1.5-5 kW, and 100-800 sccm, for high-pressure operation. While increasing the pressure from a few Torr to over 100 Torr, the sliding short, coupling probe and the substrate position are adjusted to place and keep the discharge over and in good contact with the substrate. After the desired pressure and gas flow rates are reached, the probe, sliding short and the substrate position are further adjusted to achieve temperature uniformity over the substrate. Additionally the coupling probe and sliding short are tuned to achieve a suitable microwave power match while still achieving substrate temperature deposition uniformity. Thus the three independent adjustments, i.e. sliding short, coupling probe and substrate position, enable the placement of the discharge over and in contact with the substrate there by enabling uniform substrate deposition temperature and deposition uniformity.

Other microwave reactor and process technologies have been developed to produce polycrystalline diamond at high-pressure conditions. Research groups such as Element Six, Osaka University in Japan [52], Fraunhofer I A F, Freiburg, Germany [53], and the Institute of Applied Physics at Nizhniy Novgorod, Russia [54] have developed microwave assisted CVD technologies that can produce thick (1-4 mm)

high quality polycrystalline windows (one to four inch diameter) for mm-wave and optical applications. (See e.g., Kobashi, K, *R&D of diamond films in the Frontier Carbon Technology Project and related topics. Diamond and Related Materials,* 2003. 12(3-7): p. 233-240; Funer, M., C. Wild, and P. Koidl, *Novel microwave plasma reactor for diamond synthesis. Appl. Phys. Lett.,* 1998. 72(10): p. 1149-1151; and Vikharev, A. L., et al., *Diamond films grown by millimeter wave plasma-assisted CVD reactor. Diamond and Related Materials,* 2006. 15(4-8): *p.* 502-507.)

Recently CVD diamond synthesis for high quality, high rate homoepitaxial growth of single-crystal diamond was demonstrated. (See e.g., Yan, C. S., et al., *Very high growth rate chemical vapor deposition of single-crystal diamond. Proc. Natl. Acad. Sci.,* 2002. 99: p. 12523-12525.) Using a microwave plasma CVD process, a MPCR (a modified Wavemat design), and synthetic high pressure high-temperature (HPHT) diamond substrates, single-crystal diamond at rates from 30-150 microns per hour were synthesized. These deposition rates were larger than the rates previously observed for polycrystalline diamond synthesis and the single-crystal diamond product was superior to the CVD synthesized polycrystalline diamond product. Thus the research results stimulated worldwide research in single crystal diamond synthesis. (See e.g., U.S. Pat. Nos. 6,858,078; 7,115,241; 6,582,513 6,858,080; 7,122,837; and 7,128,974.) While these patents generally discuss to the possibility of growing single crystal diamond using microwave plasma-assisted CVD, they do not elaborate, teach or discuss an actual or operable apparatus. Accordingly, a need still exists for effective single crystal diamond growth using microwave plasma-assisted CVD.

OBJECTS

Therefore, it is an object of the present invention to provide an improved system and process for growing single crystal diamond using microwave plasma and in particular to grow multiple diamond samples simultaneously.

SUMMARY OF THE INVENTION

The present invention relates to a process for growing diamond in microwave plasma, which comprises: providing a substrate holder as a first disc for growing the diamond with at least a first recess around a longitudinal axis of the holder for holding a growth substrate, wherein the holder defines a second recess positioned around the longitudinal axis of the holder and extending a predetermined distance above the first recess forming a growth volume space, wherein a recess extending means is provided in the plasma for extending the distance of the second recess above the first recess along the longitudinal axis thereby increasing the growth volume space as the substrate grows in thickness; placing the substrate in the first recess; placing the holder in the plasma reactor so that the plasma can contact the holder and substrate in the growth volume space; generating a plasma in the reactor comprising methane, hydrogen and optionally nitrogen in an amount and at a temperature and pressure which deposits the diamond on the substrate to provide a first thickness of diamond; extending the distance of the second recess above the substrate and increasing the growth volume space with the recess extending means and depositing a second thickness of diamond; and stopping the diamond growth in the reactor and opening the reactor to provide the substrate with at least the first and second thicknesses of diamond. The holder can be fabricated from molybdenum. In further embodiments the substrate is a member selected from the group consisting of diamond and silicon. In still further embodiments, the diamond growth on the substrate forms polycrystalline diamond. Further still, the diamond growth was boron doped by adding diborane ($B_2H_6$) into the reactor thereby producing boron doped diamond (BDD). Further still, the substrate is a diamond chip and the diamond growth is single crystal diamond (SCD). In still further embodiments, a plurality of first and second recesses defined on the first disc spaced apart with respect to each other defining parallel longitudinal axis into the plasma, each of the plurality of first and second recess is adapted to hold a substrate for simultaneous multiple diamond growth. Further still, the diamond chips in each of the plurality of recesses can be individually adjusted in height relative to a top surface of the substrate holder by placing an insert defining an optionally different thickness with respect to any other insert underneath each substrate such that the temperature of each chip can be adjusted to a suitable value for deposition. In yet an even further embodiment, each substrate is grown into a thickness range position such that a top portion of the substrate is located from just below to just above the top surface of the second recess. In still a further embodiment, the temperature at each of the plurality of recesses is controlled by adjusting the plasma, a cooling means, or the substrate height into the plasma or combinations thereof to create temperature uniformity among each of the plurality of substrates. In yet a further embodiment, the methane, hydrogen and optionally nitrogen of the plasma are introduced into the reactor as a feedgas further adding diborane ($B_2H_6$) in the feedgas in a quantity of up to 100 parts per million (ppm). In yet a further embodiment, the feedgas comprises nitrogen in a quantity of up to 1000 ppm. In still a further embodiment, the methane is provided between 3-15% of the feedgas and the reactor is operating at a pressure between 14-160 Torr, 2-3 kW and using a 2.45 GHz microwave reactor. Further still, the reactor operates under a microwave frequency selected from the group consisting of a 2.45 GHz reactor and a 915 MHz reactor.

The present invention further provides for a process for single crystal diamond (SCD) growth in microwave plasma, which comprises: providing a substrate holder as a first disc for growing the SCD with at least a first recess around a longitudinal axis of the holder for holding a SCD chip as a growth substrate, wherein the holder defines a second recess positioned around the longitudinal axis of the holder and extending a predetermined distance above the first recess and the substrate, wherein a recess extending means is provided in the plasma for extending the distance of the second recess above the first recess as the substrate grows in thickness; placing the SCD chip in the first recess; placing the holder in the plasma reactor so that the plasma can contact the holder and chip in the first and second recesses around the axis; generating a plasma in the reactor comprising methane, hydrogen and optionally nitrogen in an amount and at a temperature and pressure which deposits the SCD on the diamond chip to provide a first thickness of SCD; extending the distance of the second recess above the substrate with the recess extending means and depositing a second thickness of the SCD; and stopping the SCD growth in the reactor and opening the reactor to provide the SCD chip with at least the first and second thicknesses of the SCD.

The present invention further provides for a process for single crystal diamond (SCD) growth in a microwave plasma reactor, which comprises: (a) providing a substrate holder as a first disc for growing the SCD with at least a first recess around a longitudinal axis of the holder for holding a SCD chip as a substrate, the holder defines a second recess positioned around the longitudinal axis of the holder and extending above the first recess; (b) placing the SCD chip in the first recess; (c) placing the holder in the plasma reactor so that the plasma can contact the holder in the first recess and the second recess around the longitudinal axis; (d) generating a plasma in the reactor from a flow rate of gas comprising methane, hydrogen and optionally nitrogen in an amount and at a temperature and pressure which deposits the SCD on the diamond chip to provide a first thickness of SCD; (e) stopping the SCD growth in the reactor; (f) placing a second disc on the first disc with an opening defining a third recess above and around the longitudinal axis of the first disc; (g) closing the reactor and starting growth of a second section of the SCD over the first section of the SCD to provide a second thickness of SCD over the first thickness of SCD; and (h) stopping the SCD growth in the reactor and opening the reactor to provide the SCD with the first and second thicknesses of SCD. The substrate holder can be fabricated from molybdenum. In further embodiments, the second recess defines a larger cross sectional area than that of the first recess taken perpendicular to the longitudinal axis of the holder. Still further, steps (b) to (h) are repeated for growing one or more additional thicknesses of the SCD. Further still, a plurality of first and second recesses defined on the first disc spaced apart with respect to each other defining parallel longitudinal axis into the plasma, each of the plurality of first and second recess is adapted to hold a diamond chip. Still further, the flow rate of gas is between 100 and 1200 sccm of hydrogen, methane and optionally nitrogen having a molar ratio of methane to hydrogen of 3-15% and nitrogen to hydrogen of 0-10%. Further still, the recesses define a square geometry around the longitudinal axis. Further still, a side of the first disc opposite the plasma is shimmed to provide approximately the same height of an exposed surface of the diamond in the plasma at the start of each growth run. In still further embodiments, the holder is mounted on a cooler means providing a stage so as to maintain a temperature of the holder between about 850 and 1,300° C. wherein the plasma is at a pressure between about 100 and 200 Torr. Further still, the temperature is adjusted by either moving a sliding short within the reactor chamber or moving the position of the substrate holder. Still further, the diamond chip is a substrate defining a square geometry cross section of sides from 1 mm to over 1 cm. In still further embodiments, an initial cleaning of the diamond chip, reactor and substrate holder prior to step (a) and then additional cleanings in between stopping and restarting. Still further, adjustment of the plasma delivery adjusts the α parameter and thereby adjusts the horizontal and vertical growth characteristics of the SCD. Further still, each recess comprises side walls and the SCD is spaced apart from the side walls a specified distance. Still further, the specified distance the SCD is spaced apart from the side walls is from 0.1 mm to 2.0 mm.

The present invention further provides a process for single crystal diamond (SCD) growth in a microwave plasma reactor, which comprises: (a) providing a molybdenum holder as a first disc for growing the SCD with at least a first recess around a longitudinal axis of the holder for holding a SCD chip as a substrate, the first disc being mounted on a movable stage; (b) a second disc defining a second recess positioned around the longitudinal axis of the holder and above the first recess mounted on a stationary element; (c) placing the SCD chip in the first recess; (d) placing the holder in the plasma reactor so that the plasma can contact the holder in the first recess and the second recess around the longitudinal axis; (e) generating a plasma in the reactor comprising methane, hydrogen and optionally nitrogen in an amount and at a temperature and pressure which deposits the SCD on the diamond chip to provide a first thickness of SCD; (f) lowering the first disc within the chamber by the movable stage operable to longitudinally raise or lower the first disc holding the growing SCD such that the second disc remains stationary with respect to the first disc thereby increasing the growth area for the SCD between the first and second disc; (g) continuing growth of a second section of the SCD over the first section of the SCD to provide a second thickness of SCD over the first thickness of SCD; and (h) stopping the SCD growth in the reactor and opening the reactor to provide the SCD with the first and second thicknesses of SCD. In further embodiments, the second disc defining the second recess defines a cross sectional area larger than that of the first recess. Further still, steps (e) to (g) are repeated for growing one or more additional thicknesses of the SCD before stopping the reactor in step (h). Still further, a plurality of first recesses defined on the first disc spaced apart with respect to each other defining parallel longitudinal axis into the plasma, each of the plurality of first recess is adapted to hold a diamond chip.

The present invention provides a microwave cavity plasma reactor (MCPR) for growing diamond which comprises: a substrate holder as a first disc having at least a first cavity defining a first and second recess around a longitudinal axis of the holder for holding a growth substrate, wherein the second recess extends a predetermined distance above the first recess forming a growth volume space; a reactor chamber enclosing the holder coupled to a microwave delivery means and a fluid inlet stream for generating a plasma in the reactor chamber, the plasma is comprised of methane, hydrogen and optionally nitrogen; a quartz dome for facilitating formation of a plasma discharge over the substrate; a recess extending means for extending the distance of the second recess above the substrate along the longitudinal axis thereby increasing the growth volume space; wherein the reactor is operable to grow diamond on the substrate as a first and second thickness by contacting the substrate with the plasma in the growth volume space. In further embodiments, the first disc is fabricated from molybdenum. Further still, a second disc having an opening defining a third recess positioned on the second disc for growing diamond as the second thickness on the first thickness. Still further, a cross section of the second recess taken perpendicular to the longitudinal axis is larger than that of the first disc. Further still, the substrate is a diamond chip and the diamond growth is characterized as single crystal diamond (SCD). In still further embodiments, the microwave generating means is characterized by a microwave frequency selected from the group consisting of 2.45 GHz and 915 MHz. Further still, the first disc comprises a plurality of cavities each defining a first and second recess around a longitudinal axis parallel to that of the at least a first cavity. Still further, the reactor is operable to grow a plurality of diamonds on a plurality of substrates in each of the plurality of cavities. In still further embodiments, a cooling stage for maintaining the holder at a predetermined temperature. Further still, the predeterminded temperature is between 850 and 1300° C. and a predetermined pressure in the quartz dome is between 100-200 Torr. Still further, the recess extending means is a movable stage adapted to increase the growth volume space during a reaction.

BRIEF DESCRIPTION OF THE DRAWINGS

FIG. 1 illustrates a microwave cavity plasma reactor in thermally floating substrate holder configuration;

FIG. 2a illustrates a top view of the substrate holder of FIG. 1;

FIG. 2b illustrates a thermally floating substrate holder setup;

FIG. 3 illustrates a cross sectional view of a high-pressure MCPR system shown operating with a cooling stage configuration;

FIG. 4 illustrates a cross sectional view of a particular configuration for diamond film coating on eighteen and thirty six WC-6% Co round tools;

FIG. 5 illustrates a cross sectional view of a microwave plasma jet reactor for diamond thin film coating on carbon fibers;

FIG. 6a illustrates a top view of a seal substrate holder

FIG. 6b illustrates a seal coating substrate holder setup;

FIG. 7 illustrates a substrate holder setup used in high-pressure MCPR for diamond film deposition: (a) 2" Si wafer, (b) 2" Mo substrate holder, (c) Mo ring, (d) Mo discs, (e) Mo gas flow regulator, (f) water cooling stage;

FIG. 8 illustrates a multiple single crystal diamond substrate MCPR configuration;

FIG. 9 illustrates a reactor scaling with microwave frequency (left 2.45 GHz, right 915 MHz);

FIG. 14 illustrates an isometric view of an exemplary holder design with a plurality of recess positions;

FIG. 14A schematically illustrates SCD growth in a first recess on a Si substrate;

FIG. 15 illustrates an isometric view of the exemplary holder design of FIG. 13 with a plurality of recesses and several discs;

FIG. 16 schematically illustrates an order of diamond growth process;

FIG. 17 illustrates a Molybdenum holder structure for new SCD samples (diamond chips);

FIG. 18 illustrates a Molybdenum holder structure for previously grown SCD samples (i.e. additional depositions to FIG. 17);

FIG. 19 illustrates a Molybdenum holder structure for previously grown SCD samples (i.e. additional depositions to FIG. 18);

FIG. 20 illustrates a Molybdenum holder structure for previously grown SCD samples (i.e. additional depositions to FIG. 19);

FIG. 22 shows photographs of Samples SCD#DK001 and SCD#DK002 illustrating the Influence of nitrogen on the SCD growth;

FIG. 23 shows photographs of Samples SCD#DK003 and SCD#DK004 illustrating the repeatability of SCD growth;

FIG. 24 shows photographs of Samples SCD#DK005 and SCD#DK006 illustrating that more nitrogen decreases defects on SCD;

FIG. 28C shows an array of total thickness (microns)(top number) and growth rate (microns/hour) (bottom number) corresponding to the samples from FIG. 28A;

FIG. 28D shows an array of deposition temperature (top number) and growth rate (microns/hour) (bottom number) corresponding to the samples from FIG. 28A.

DESCRIPTION OF THE PREFERRED EMBODIMENTS

Figure 10:
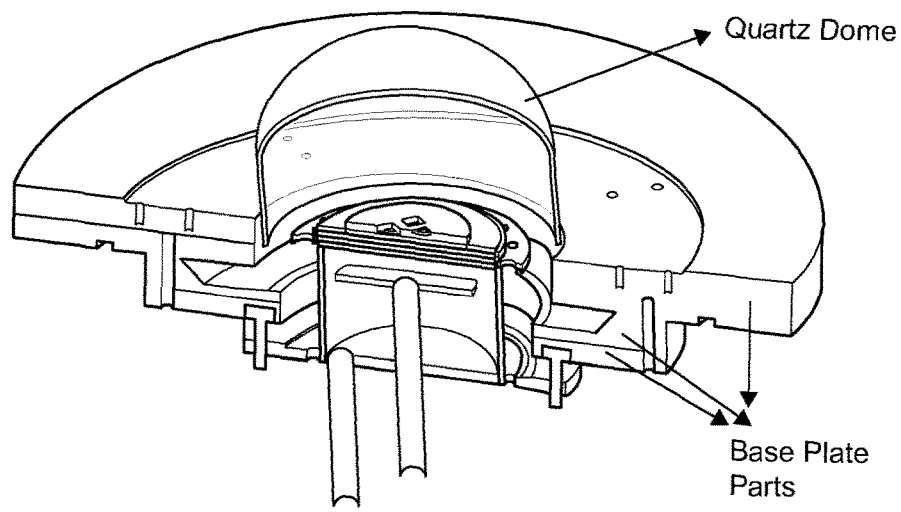
FIG. 10 illustrates an exemplary holder structure design.
Figure 11:
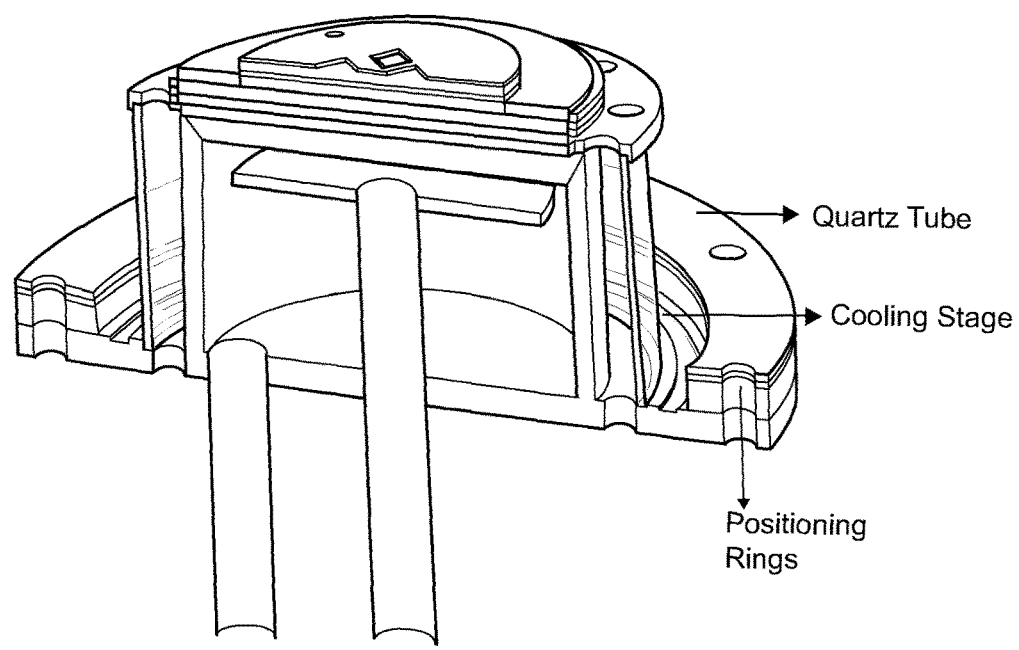
FIG. 11 illustrates the holder structure of FIG. 10 showing a cooling stage and positioning ring.
Figure 12:
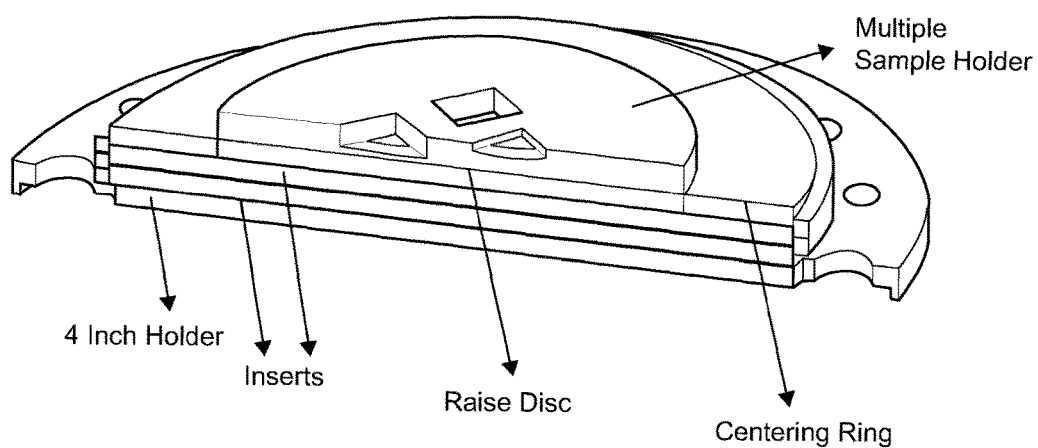
FIG. 12 illustrates a holder structure for multiple samples on a raised disc.

The present disclosure provides for diamond synthesis on crystal substrates. Particularly, the present disclosure provides for exemplary process methods and associated Chemical Vapor Deposition (CVD) deposition machine technology that is able to rapidly synthesize single crystal diamond at a low, commercially attractive cost. Furthermore, the present disclosure provides for single crystal diamond (SCD) synthesis on a substrate, particularly on an SCD substrate. An SCD substrate can be an SCD seed or an SCD chip. An SCD chip can be characterized as any piece of single crystal diamond including but not limited to industrial diamond, high temperature and high pressure synthesized diamond, gem stone diamond and/or natural diamond. An SCD chip can be formed or utilized in any geometric shape and size. Moreover, an SCD diamond can define a geometry cut on any diamond surface plane.

In an exemplary embodiment, microwave plasma assisted CVD single crystal diamond synthesis can be improved by addressing the following objectives: (i) control the quality of the synthesized single crystal diamond (both during a run and from run to run), (ii) achieve high growth rates while still synthesizing high quality single crystal diamond material, (iii) develop technologies and processes that enable the synthesis of multiple single crystal substrates, and (iv) scale up the process further to simultaneously synthesize multiple (>100) substrates, i.e. develop and process test large area 915 MHz reactor technology and associated processes.

In a particular exemplary embodiment, a water-cooled, high pressure, 2.45 GHz MCPR (see FIG. 3) is employed to further include a substrate holder configuration to accommodate multiple high-pressure high-temperature (HPHT) grown diamond substrate seeds. Using 2.45 GHz excitation and existing 17.8 cm diameter MCPRs, an advantageous substrate holder configuration was designed and developed that was associated with processes that enable the controlled deposition of one to many single crystal substrates per process run. Additionally processes, holders, etc. that were developed using the 2.45 GHz MCPR had to be scalable to operate in the much larger eighteen inch diameter, 915 MHz MCPR reactor. Accordingly, in an exemplary embodiment a uniform, large area deposition area that enables uniform, controlled, single crystal deposition simultaneously over many substrates was achieved. In certain embodiments related to the present disclosure, deposition rate per substrate may be sacrificed in order to achieve a uniform controlled deposition over many substrates.

The present disclosure is described and illustrated with reference to the following particular exemplary embodiments by way of examples:

Example I

A. MCPR Loaded with Multiple Diamond Substrates

A cross sectional view of an exemplary MCPR loaded with multiple diamond substrates is shown in FIG. 8. As shown the substrate holder configuration is water-cooled and employs a molybdenum disk set similar to those described in FIG. 7. The molybdenum disk set and substrate holder itself (10) are designed to accommodate either one or multiple diamond substrates. Reactor tuning and plasma control, and efficient creating, maintaining, and positioning of a hemispherical discharge over the substrates are carried out according to previously described procedures. In an exemplary embodiment, when using 2.45 GHz excitation, the substrate holders can accommodate up to as many as 10-20 diamond substrates for one run. The exact shape/configuration of the substrate holder and the disk set varies as the deposition processes develops versus process time and even the method/geometry of positioning and holding the diamond substrates changes versus process time. This was achieved in-situ using suitable reactor technology, i.e. adjusting the variable sliding short and probe, variable substrate holder positioning and variable input power. Reactor configuration and its many design and process variations are discussed in further detail hereinbelow. In all experimental runs, the plasma size is adjusted to cover a large area, i.e. up to 4 inch diameters in the 2.45 GHz system and up to 6 to 8 inch diameters in 915 MHz systems. While most experiments were performed using the water cooled configuration of FIG. 8, the thermally floating configuration of FIG. 2 could also be employed for single crystal diamond growth.

B. Reactor Scaling

Figure 21:
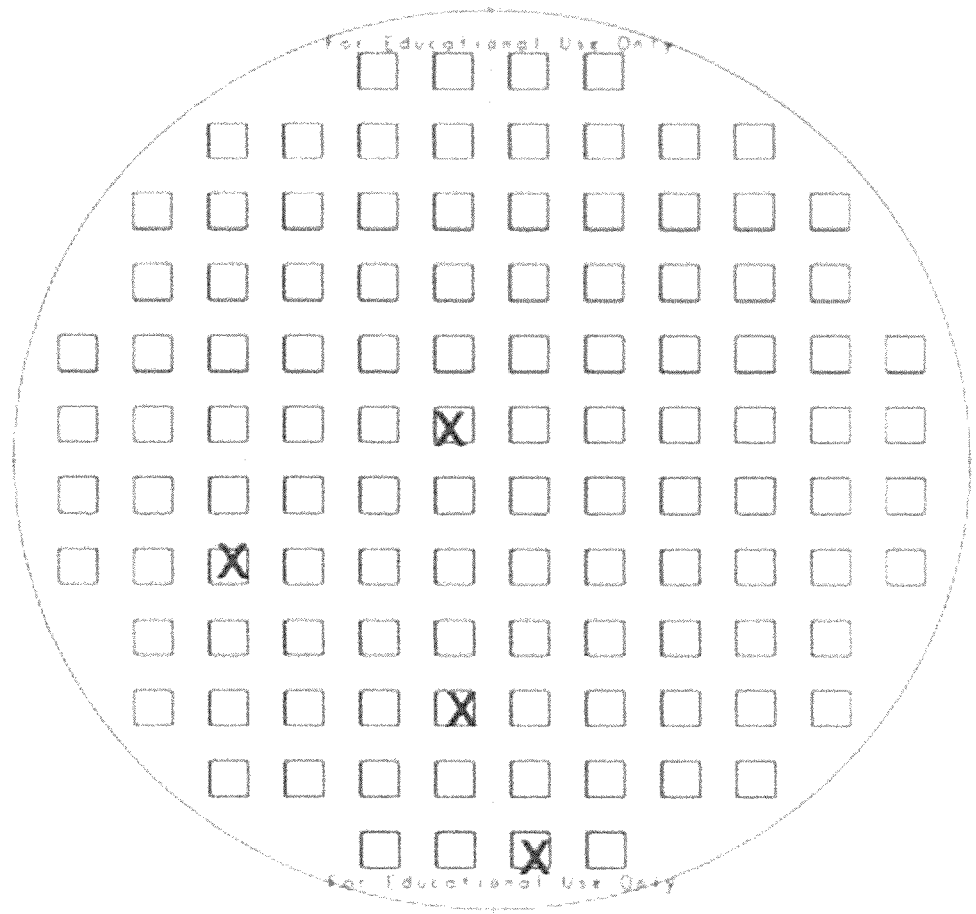
FIG. 21 illustrates a top schematic view of a first disc having a plurality of recesses with 4 samples positioned on a 4" substrate holder.

In an exemplary embodiment, an exemplary MCPR, associated substrate holders and the process itself can be scaled to much larger deposition areas by dropping the excitation frequency to 915 MHz and scaling up the MCPR size to 460 mm diameter with an associated discharge size of 330 mm diameter. This reactor and discharge scaling are shown in FIG. 9. The process scaling allows the substrate holder configuration to be enlarged to accommodate many single crystal diamond substrates. FIG. 21 illustrates an exemplary 915 MHz substrate holder (10) configuration that is able to simultaneously process over one hundred diamond substrates.

C. Single Crystal Work on 2.45 GHz Reactor

A first set of experiments determined growth rates of 10 microns per hour at a pressure of 160 Torr and a process gas composition of 7% Methane and 93% of Hydrogen. Addition of 400 ppm Nitrogen to the process gas composition increased the growth rate to 30 microns per hour. Analysis of the process data and the sample properties from numerous runs showed that the sample temperature has a substantial effect on the quality of the surface of the sample. A polycrystalline frame that grew during the experiments, which were run at around and above 1300° C., was not detected for those which were run at around 1100° C. In addition, the experiments which were run below 1050° C. have resulted with samples completely grown with a polycrystalline film. Therefore, it is desirable that experiments are run at around 1100-1250° C.

Additional experiments were conducted with changing Methane percentages. During these runs pressure was kept relatively steady at about 160 Torr and Nitrogen percentage at 400 ppm. Methane percentages were varied between 7 to 14% and achieved 30 to 45 microns/hour growth rate, respectively. However, having a higher Methane ratio resulted in limited lifetime of quartz domes. Some of the runs were stopped after only 5 hours due to carbon deposition on the dome. These domes were either cleaned with hydrofluoric acid solution and reused, or they were discarded as waste. After these runs, it is concluded that 7-10% Methane ratio provided suitable results.

Pressure is increased from 160 Torr to 180 Torr and the Methane ratio was reduced down to 8.5 percent in order to increase the life of quartz domes and to execute longer runs. Since the increase in pressure reduces a plasma ball's size, it was considered that keeping the plasma ball away from the quartz dome walls will increase the overall life of the quartz dome. Moreover, lowering the Methane ratio will help reduce the likelihood of carbon deposition on the dome walls. Additionally, increasing the pressure also increases the growth rate of diamond.

Nine experiments were conducted at the 180 Torr pressure and 8.5% methane ratio composition. These experiments showed that the average growth rate increased to 40 to 45 micron/hour. Additionally, the life of the quartz domes improved substantially. However, all the samples from these runs ended up with an impurity/imperfection on the grown film. Based on runs executed, a process window was established for repeatable growth of single crystal diamond that consists of 160 Torr, 9% methane, 400 ppm nitrogen and a substrate temperature of 1100° C. The set of deposition conditions gives of growth rate of 35-40 microns/hr. Sample growth up to a total thickness of 4.75 mm has been achieved.

D. Growth Process

Single crystal diamond samples are often received with dirt and residue from a supplier. These samples are typically first run through an acidic and ultrasonic cleaning procedure to remove the dirt and residue that are present on the sample surface. In an exemplary embodiment, acidic cleaning can be achieved by any of the following exemplary technique:

1. Add sample into a solution of Nitric Acid (20 mL)+Sulfuric Acid (20 mL) in a beaker and then heat the solution to boiling temperature by placing the beaker; for example, on a basic heater (set to 10 or max) for approximately 15 minutes (there is no temperature measurement on the heater or in the beaker, the acidic solution needs to be at boiling temperature); then rinse sample in DI water;

2. Add sample to Hydrochloric Acid (30 mL) in a beaker and heat on a heater (set to 10 or max) for 10 minutes (there is no temperature measurement on the heater or in the beaker, the acidic solution needs to be at boiling temperature); then rinse sample in DI water; and 3. Add sample to Ammonium Hydroxide (30 mL) in a beaker and heat on a heater (set to 10 or max) for 10 minutes (there is no temperature measurement on the heater or in the beaker, the solution needs to be at boiling temperature; then rinse sample in DI water.

Ultrasonic cleaning can be achieved according to the following exemplary techniques:

1. Place sample in an ultrasonic bath with Acetone (30 mL) in a beaker for 15 minutes; and
2. Place sample in an ultrasonic bath with Methanol (30 mL) in beaker for 15 minutes.

Final rinsing and drying is generally desirable by rinsing the sample with DI water and then drying. In an exemplary embodiment, drying is accomplished by blowing nitrogen on the sample to remove water. The sample can then be placed in a clean and new Petri dish if desired.

E. Substrate Holder Preparation

In an exemplary embodiment a Molybdenum substrate holder and associated mechanical parts of an exemplary chamber are cleaned before every deposition process according to the following suitable cleaning procedure:
1. Sand Blasting—The Molybdenum (Mo) pieces that go into the chamber are sand blasted (cleanliness of the Multiple Sample Holder (MSH) ensures and promotes desirable product achievability; if MSH is not sufficiently clean, localized polycrystalline diamond growth will likely start and adversely affect the plasma);
2. Ultrasonic cleaning of all Mo pieces (with water or a solvent);
3. Rinsing and nitrogen blowing; and
4. Drying the Mo pieces in a dryer at about 80° C. for about 20 minutes.

F. Substrate Loading and a Two Principle Substrate Holder Design

In an exemplary embodiment, a single crystal diamond sample is loaded into a chamber. FIG. 10 shows a detailed setup of an exemplary system according to the present disclosure. Typically the system is comprised of a stainless steel cooling stage, a quartz tube, stainless steel positioning rings, Molybdenum holders and a diamond sample.

Figure 13:
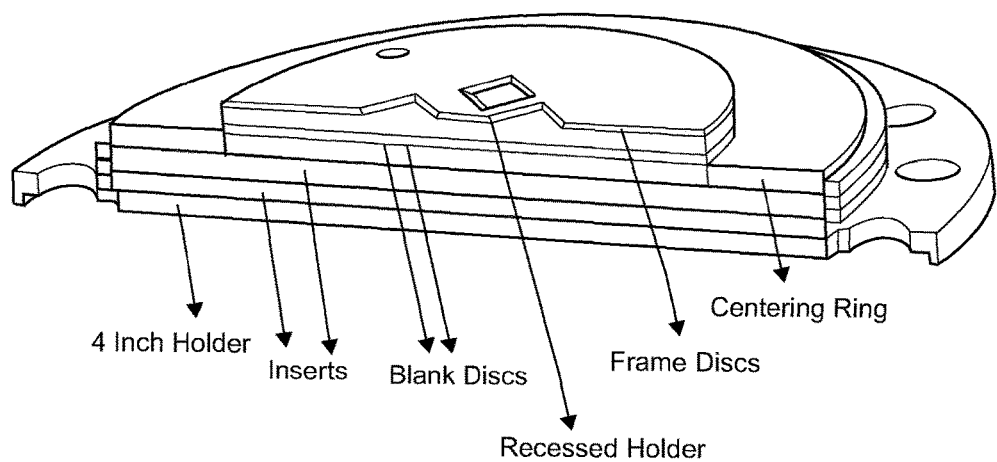
FIG. 13 illustrates a further embodiment of a holder structure with a recessed holder and blank discs.

In an exemplary process, the quartz tube is attached onto the cooling stage. The positioning rings are attached to the base plate. The positioning rings are available in various thicknesses. In an exemplary embodiment, positioning rings are available in thicknesses of 7, 4, 2 and 1 mm. With reference to FIGS. 10-13, the Mo pieces are mounted on top of the cooling stage. In an exemplary embodiment, the Mo pieces are positioned relative to the cooling stage in the following order: a four inch holder; inserts (FIG. 13 shows two inserts); a centering ring; a multiple sample holder (MSH). In a particular embodiment, a 2 inch raise disc (See FIG. 12) is used defining a plurality of recesses. In an exemplary embodiment, the recess dimension size is 6×6×1 mm for new samples and a recess dimension size of 6×6×2 mm is suitable for grown samples.

In further embodiment (See FIG. 13), blank disks of various thicknesses are employed. Exemplary blank discs can be 1, 2 or 4 mm in thickness. The embodiment as illustrated in FIG. 13 further comprises a recessed holder and frame discs of various thicknesses. Exemplary frame discs can be 1, 2 or 4 mm in thickness. Typically, thickness of the discs depends on the condition of the sample, e.g. new sample, grown one time, grown two times, etc.

Single crystal diamond (SCD) Substrate set up can be achieved according to the following exemplary process:
1. Load a clean SCD substrate using clean tweezers into a designated recess;
2. Load the Mo pieces onto the cooling stage;
3. Load the stage onto the base plate;
4. Install the door of the chamber; and
5. Start pump down process.

G. System Start-Up

In an exemplary embodiment, the mechanical and electrical components of the system are turned on prior to the process start. In a further embodiment, the system is pumped down over night (i.e., more than 12 hours) to ensure that all the air inside the chamber is evacuated and there is no leak and residual gas left inside the chamber. Accordingly, in an exemplary embodiment, it is suitable to employ the following procedural steps:
1. Turn on chiller;
2. Turn on microwave power supply;
3. Turn on rectangular waveguide cooling fan (small blower);
4. Pump down over night;
5. Adjust short position to 20.8 cm;
6. Adjust probe position to 3.9 cm.

H(1). Deposition Process (Start Up)

In a particular embodiment, In-situ ($H_2$) cleaning is performed. The first in-situ process step is plasma cleaning of the sample with Hydrogen etching. This process cleans up the sample surface and removes the defects and impurities that were not removed during the chemical cleaning process. This cleaning is achieved according to the following exemplary steps
1. Turn on applicator purge;
2. Turn on main gas valve;
3. Turn on $H_2$ valve;
4. Input 500 sccm for $H_2$ flow;
5. Input 10 Torr for Pressure;
6. At 5 Torr Turn on Microwave (MW) power;
7. Set MW power to 0.5 kW;
8. If it fires OK, set 950 sccm for $H_2$ flow;
9. Set 160 Torr for Pressure;
10. After about 10 minutes, turn on external fans;
11. Adjust power accordingly, increase forward power as the pressure increases, keep the reflected power below 0.4 kW as the forward power increases.
12. After it reaches 160 Torr, set 400 sccm for $H_2$ flow;
13. Turn on all interlocks; and
14. Run system for about 3 hours for new samples, for 0.5 to 1 hour for previously grown samples.

H(2). Diamond Deposition

Diamond deposition is accomplished in an exemplary embodiment according to the following steps:
1. Open $CH_4$ and $N_2/H_2$ valves;
2. Set 10 sccm for $CH_4$ flow;
3. Every half minute increase $CH_4$ flow by 10 sccm up to 40 sccm (can be changed depending on the experiment);
4. Set 8 sccm for $N_2/H_2$ flow;
5. Run as long as necessary or desired;
6. Gas purities:
   $CH_4$: 99.999%
   $H_2$: 99.9995%
   $N_2/H_2$: 2% $N_2$, Balance $H_2$.

H(3) Deposition Process (Shut Down)

Process shut down can be achieved according to the following exemplary steps with particular attention to safety:
1. Turn off all interlocks;
2. Turn off MW power;
3. Turn off gas valves;
4. Set 0 sccm for all gas flow;
5. Set 0 Torr for pressure (pressure brought down to 0 at once);
6. Cool down for 3 hours; and
7. Open the chamber.

I. Process for SCD Deposition for Multiple Runs

A diamond deposition process is typically interrupted or stopped as a result of various circumstances including but not limited to: high temperature of the sample, coating on the quartz dome, and localized polycrystalline growth on the Mo holders. Despite breaks in an exemplary overall growth process, a deposition process according to the present disclosure can be continued on the same sample using appropriate ex-situ and in-situ (e.g. chemical and hydrogen cleaning) processes in combination with suitable substrate holder design.

FIG. 14 illustrates an exemplary isometric view of a particular holder design that is used during deposition experiments. This holder defines a plurality of recesses of various depths. A particular recess is chosen based on the thickness of the sample (e.g. new, previously grown once or previously grown twice, etc).

Figure 14B:
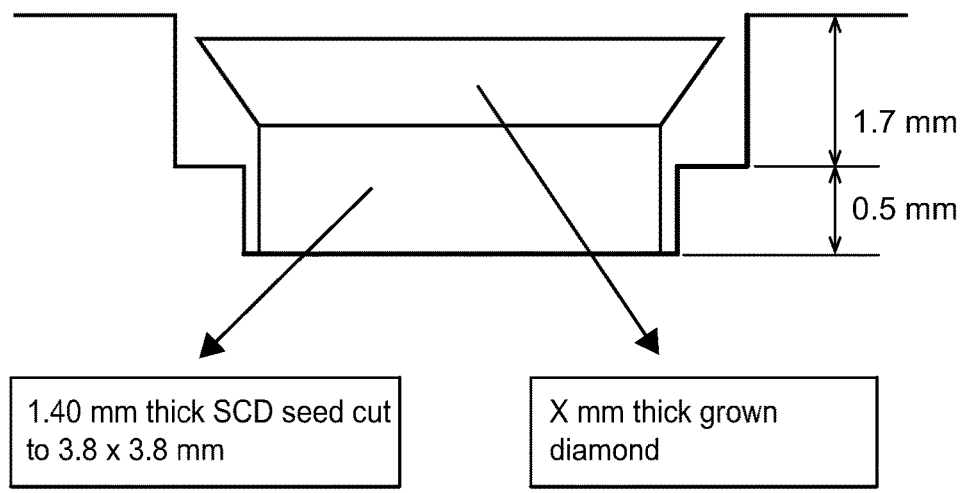
FIG. 14B schematically illustrates SCD growth in a first recess on a diamond chip substrate for an X mm thickness.
Figure 14C:
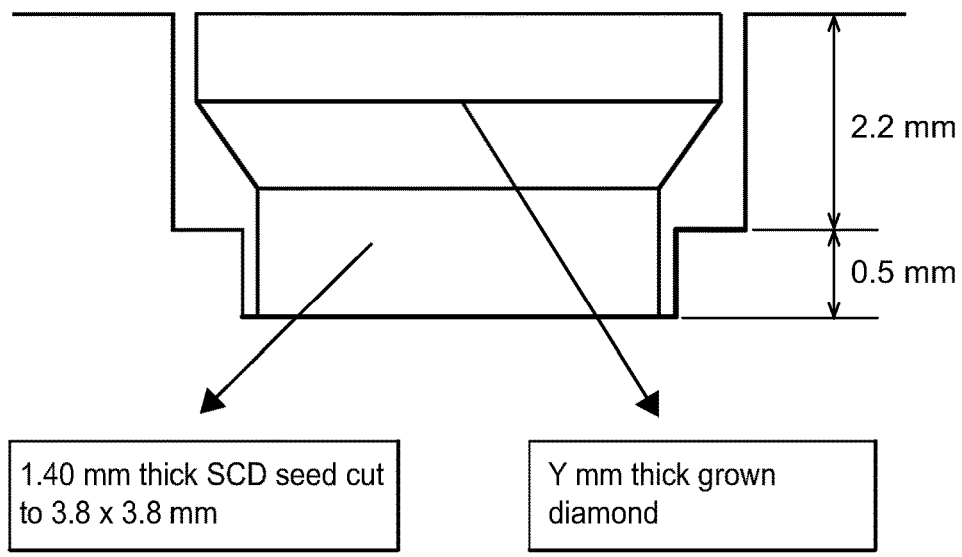
FIG. 14C schematically illustrates SCD growth in a first recess on a diamond chip substrate for a Y mm thickness.
Figure 14D:
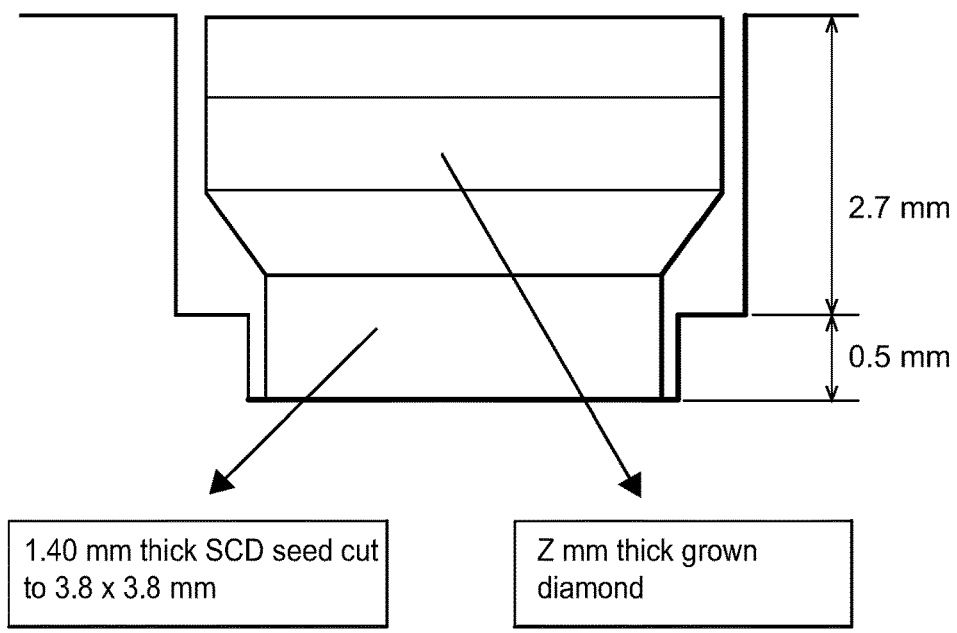
FIG. 14D schematically illustrates SCD growth in a first recess on a diamond chip substrate for an Z mm thickness.
Figure 14E:
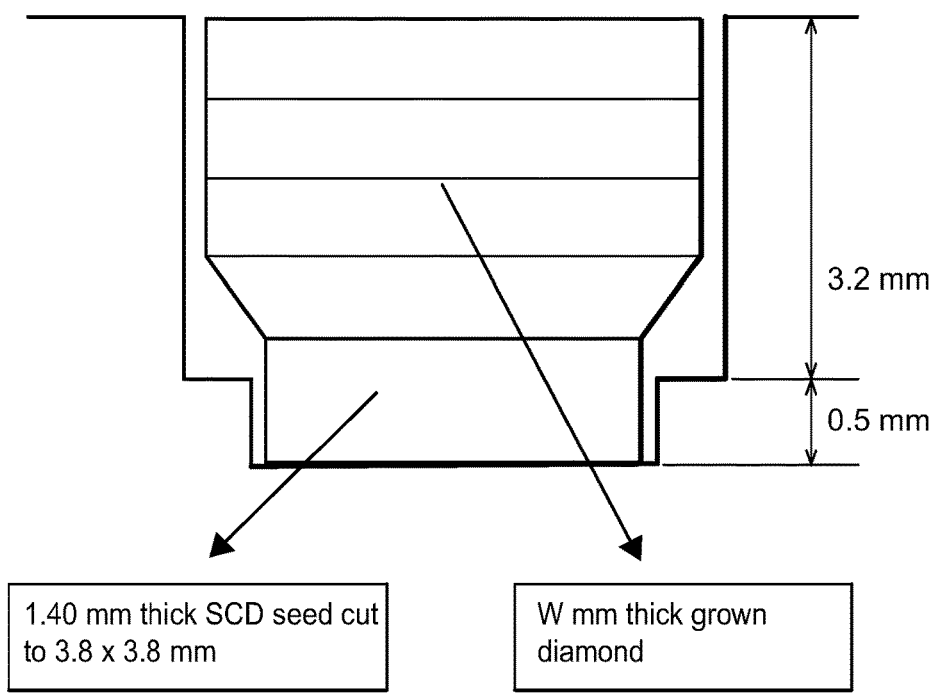
FIG. 14E schematically illustrates SCD growth in a first recess on a diamond chip substrate for an W mm thickness.

Referring to FIGS. 14A, 14B, 14C, 14D, and 14E, an exemplary process for deposition in the plurality of recesses of various thicknesses is schematically shown. FIG. 14A illustrates a first deposition in a first particular recess of a Si wafer substrate, 0.45 mm thick cut to a 4×4 mm dimension. In an additional embodiment, as shown in FIG. 14B, a Si wafer substrate is not used. Alternatively, a deeper recess can be chosen as shown in FIGS. 14C-14E. The recess chosen should depend on the desired growth thickness as schematically depicted in the Figs. Accordingly, recess #2 (desired thickness of Y mm) is deeper than recess #1 (desired thickness of X mm), recess #3 (desired thickness of Z mm) is deeper than recess #2 and recess #4 (desired thickness of W mm) is deeper than recess #3.

J. Process for SCD Samples for Multiple Runs with Additional Embodiment (FIG. 13)

A diamond deposition process is typically interrupted or stopped as a result of various circumstances including but not limited to: high temperature of the sample, coating on the quartz dome, and localized polycrystalline growth on the Mo holders. Again, despite breaks in an exemplary overall growth process, a deposition process according to the present disclosure can be continued on the same sample using appropriate ex-situ and in-situ (e.g. chemical and hydrogen cleaning) processes in combination with suitable substrate holder design.

Multiple SCD samples can be grown simultaneously according to a particular exemplary design holder. Moreover, recess depth can be adjusted by adding multiple frame discs on top of each other. FIG. 15 Illustrates an isometric view of an exemplary multiple SCD growth holder design that is suitable for deposition experiments having a plurality of discs.

FIG. 16 shows an exemplary order of diamond growth process with a particular holder design. As the sample grows and the process is stopped, the Mo holder structure is adjusted according to desired outcome. For example, more discs are added during stoppage to increase sample growth thickness. Cleaning can also be achieved during the stoppages. In an exemplary growth process, some of the blank discs will be removed from the bottom and framed discs will be added on top depending on the total thickness of the SCD sample.

FIGS. 17-20 illustrate exemplary embodiments of adding additional discs during multiple depositions of a particular sample. FIG. 17 represents a first deposition disc embodiment for a new SCD sample. FIG. 18 illustrates an embodiment of FIG. 17 further comprising additional discs to allow for additional growth of a previously grown SCD sample or samples. Each recess can grow a separate and distinct SCD sample. Depending on the desired thickness of a particular sample, a third deposition can be achieved as shown in FIG. 19 by stacking additional discs to the embodiment shown in FIG. 18. FIG. 20 is an even further extension of adding more discs to the embodiment of FIG. 19. Thus, FIG. 18 represents growth of a sample to an X mm thickness (second deposition); FIG. 19 to a Y mm thickness (third deposition); and FIG. 20 to a Z mm thickness (fourth and n*th deposition).

K. Single Crystal Diamond Using 915 MHz

Initially a 915 MHz microwave delivery system was evaluated by demonstrating diamond growth on multiple samples operating with no nitrogen added to the growth chemistry. As seen in Table 1 below, the 915 MHz system showed repeatable deposition rates for multiple crystals placed at different locations (i.e., different recesses). The deposition rate was 6-7 microns per hour. This rate is comparable to results obtained from, a 2.45 GHz system for no nitrogen conditions.

TABLE 1

| Sample ID Number | First Experiment Growth Rate (microns per hr) | Second Experiment Growth Rate (microns per hr) |
| --- | --- | --- |
| 81 | 6.53 | 7.76 |
| 82 | 5.38 | 5.65 |
| 83 | 6.12 | 6.20 |
| 84 | 6.80 | 6.47 |
| Average Growth Rate | 6.208 | 6.520 |

Operating Conditions: 1130° C., 130 Torr, 7% CH4, 0% $N_2$

Referring to FIG. 21, in an exemplary SCD holder apparatus, a multi-seed deposition was performed. FIG. 21 schematically illustrates an exemplary embodiment of an apparatus defining a plurality of recesses filled in four different positions with SCD samples or seeds. In an exemplary embodiment, a 4" substrate is employed. Improving growth rate using a nitrogen/hydrogen mixture procedure was investigated. This procedure was similar to that used from the 2.45 MHz system for purposes of verifiability. Accordingly, adding 175 ppm nitrogen effectively increased the growth rate up to 16 microns per hour for sample SCD#DK002 as shown in FIG. 22.

Increasing nitrogen flow rate proved to increase growth rate. Changing nitrogen flow rate from 175 ppm to 300 ppm provided a growth rate of 20.3 microns per hr as shown in FIG. 23. Repeatability was tested by running a shorter experiment, which provided a growth rate of 18.39 microns per hour. Although the recorded value is lower, growth duration will influence the calculated growth rate by replacing the material lost during etching. The longer the growth period the less significant the etched material enters into the calculation. Additionally decreasing the number of defects also was achieved. As shown in FIG. 23, sample SCD#DK003 and SCD#DK004 are examples of the repeatability of the process according to the present disclosure.

Following the growth rate experiments another multi-seed deposition was conducted with samples SCD#DK005 and SCD#DK006 as shown in FIG. 24. The growth rates were similar to the previous depositions of FIG. 23 (FIG. 24 shows growth rate of 19.54 and 17.88 microns per hour), however, decreased defects were maintained during the multi-seed run as shown in FIG. 24. These experiments were conducted at a pressure of 130 Torr, which is less than the 160 Torr used in the 2.45 GHz system. This lower pressure may be attributable to be a major reason for the lower growth rates (~20 microns/hr) as compared to the 35-40 microns per hour in the 2.45 GHz system. Higher pressures will be more readily utilized with the installation of the nitrogen generator system, which will provide greater safety in the operation of the 915 MHz system.

In an exemplary embodiment, the present disclosure provides for an apparatus and process for growth of single crystal diamond on diamond substrate. Growth of single crystal diamond in microwave plasma-assisted CVD at pressures of 100-200 Torr is sustainable through proper management of process operating conditions including: substrate temperature; plasma/gas chemistry; substrate preparation (cleaning); and plasma/gas flow rates. A different set of operating conditions for these parameters will result in favorable outputs depending on the different single crystal diamond variations that can be grown and are desirable. Variations in SCD's that can be grown include and can depend from the amount of nitrogen in the gas feed, boron in the gas feed, and methane in the feed gas. Moreover, these feed gas variations produce diamond of different quality including color, growth rate, electrical and optical properties. In a particular embodiment, improved quality of diamond synthesis is attributable to establishing a growth environment with appropriate substrate temperature, plasma species, plasma/gas flow rates and their uniformity across the diamond substrate.

In an exemplary embodiment, the present disclosure provides for an apparatus and process adapted to allow for subsequent sustaining of particularly desirable conditions for diamond deposition. The following exemplary techniques are suitable to achieve and maintain desirable substrate temperature:

a. Using a multilayer molybdenum substrate holder structure that sits on a cooler and inserting or removing layers in this holder structure thereby establishing and/or maintaining desired temperature;

b. Positioning the plasma with respect to the substrate by raising and lowering the substrate cooler/holders and by raising and lowering a top sliding short;

c. Adjusting the input power to change/optimize the substrate temperature;

d. Positioning the diamond substrate in a holder structure such that a top surface of the diamond is within a specific range of the top surface of the molybdenum holder that the diamond is held in—a typical range is from 0.5 mm below the top surface of the molybdenum to 1.0 mm above the top surface of the molybdenum;

e. Placing a separate insert into a recess of the molybdenum holder such that the diamond sits on the placed insert instead of directly on the molybdenum thereby discretely adjusting the vertical position of the diamond substrate and adjusting the thermal connection between the diamond and the molybdenum;

f. Verifying that the correct temperature can be obtained before a deposition run is started by running a hydrogen plasma without in carbon source—the temperature of the substrate during this pre-run check indicates or is predictive of the temperature to be expected during a deposition run;

g. Running the deposition only when the substrate temperature is maintained within a specific range since the deposition temperature often changes during a run as the diamond grows and extends further above the molybdenum substrate holder—once a specific temperature range is exceeded, the run is stopped and the diamond is reconfigured in the substrate holder to obtain the correct substrate temperature alternatively the power, substrate position and/or top sliding short can be adjusted to maintain a specific temperature range;

h. Utilization of appropriate laterally sized recesses in the molybdenum to control the temperature and gas flow around the diamond substrate; and/or In a further exemplary embodiment, the present disclosure provides for deposition of diamond on multiple seed crystals simultaneously. Depositing single crystal diamond on multiple crystals simultaneously is accomplished by utilizing apparatus and process conditions that 1) provide a plasma discharge of sufficient uniformity and size to deposit diamond over a large area at high rates, and 2) provide the capability to operated with all diamond seeds within a specific substrate temperature range. The following exemplary techniques are suitable for achieving and/or facilitating SCD deposition on multiple crystals:

a. The substrate holder can be designed with variable controlled thermal connection to the substrate cooler that varies versus radial position;

b. Since each substrate is relatively small, they can be placed in a substrate holder that varies in either thickness or recess depth to achieve relative uniform temperature for all the crystals;

c. A process can be defined where the temperature of each seed crystal is determined before a run begins by running with just a hydrogen plasma interacting with the multiple seed crystals—a pyrometer can be used to map the temperature of each seed crystal—the process can then be stopped and the position of each seed crystal adjusted by either moving it to recesses of different depth or placing thin inserts under selected seeds to adjust their temperature;

d. extending the run time between starting and stopping of the process by maintaining the top of the diamond within a certain distance of the top of the molybdenum which is achievable by placing the seed crystals close enough together that the plasma interacts with just diamond surfaces spaced just a few mm apart—this reduces polycrystalline diamond growing on molybdenum which requires the process to be stopped often to clean the molybdenum (Note: This configuration starts to look like depositing on a large continuous wafer surface); and/or e. Using a holder configuration defining a plurality of recesses to deposit on multiple seeds at the same time.

High rate synthesis of high quality single crystal diamond (SCD) is achievable through adjustment of environmental factors inside the reactor. Particular diamond deposition variables suitable for adjustment include: (1) reactor pressure, (2) input microwave power, (3) substrate temperature, (4) radical deposition species concentrations, and (5) the geometric position of local substrate top surface and top edges with respect to the plasma and the substrate surface. In an exemplary embodiment, experimentally determined "high rate, high quality diamond deposition" can occur within (1) 100-200 Torr and particularly within 120-180 Torr, (2) a substrate temperature between 1050-1200° C., (3) input gas flow rate of 100-1200 sccm, and (4) a methane to hydrogen concentration of 3-15%. In a further exemplary embodiment, deposition results were observed at pressures of 160-180 Torr, 6-10% methane, and substrate temperatures of 1100-1200° C. According to the experiments, input power and cavity tuning were adjusted to create a microwave discharge hovering over and in contact with and covering the substrates. Typically the absorbed input microwave power was within the range of 2-3 kW. The addition of a small amount (5-500 ppm) of nitrogen gas improved growth rates and with the addition of only very small concentrations of nitrogen (5-50 ppm) the diamond quality also improved.

The experiments also demonstrated that the single crystal diamond substrate can be positioned appropriately within the microwave discharge. For example, placing the HTHP SCD substrate directly on top of a flat Mo holder where the top, edges and sides were exposed to the plasma did initially deposit SCD diamond, but as deposition progressed polycrystalline diamond formed on the sides and also produced a polycrystalline rim around the substrate. As growth continued substrate deposition hot spots were formed either on the substrate top edges or on the substrate holder itself producing undesirable runaway polycrystalline growth over the entire substrate. In order to reduce the polycrystalline growth around the rim and also to control runaway growth the local deposition environment surrounding the substrate top surface was controlled.

Local control is achieved by placing the substrate within a recess or "well" that is defined or cut into the Mo holder. When the substrate was placed within this recess the substrate sides, edges and the top surface were no longer exposed to the intense microwave plasma and were also possibly shielded from any microwave fields that may be concentrated on the hot edges of the substrate. When the top of the substrate surface was located in the recess, as is shown in FIG. 16 (first run), SCD growth was achieved without any significant formation of a polycrystalline rim/border. As shown the substrate surface is located a short distance below the top surface of the substrate holder, and also the top edge of the substrate was also located a short distance from the adjacent edge of the substrate recess. If the spacing between the edges and the surface was either too large or too small, quality SCD growth was not achieved. Under particular desired geometric conditions, as shown with respect to FIGS. 14A-14E diamond growth with minimal polycrystalline rim formation is achievable.

In a particular exemplary embodiment according to the present disclosure, as diamond was added (i.e., deposited) to a particular substrate via CVD process, the substrate grew slightly horizontally but especially in height. The substrate increased in size and it eventually grew out of the recess and into the microwave plasma. The growing substrate assumed a position within the plasma similar to that of a single crystal placed on top of a smooth Mo plate. The substrate again had to be placed within a larger recess or cavity in order to achieve high quality diamond growth. Accordingly, the present disclosure provides for synthesis of large multi-carat stones grown on a multi-substrate frame with a multi-step process.

An additional variable related to improvement of SCD growth is a substrate/recess variable. In order to achieve high quality, thick SCD growth the substrate surface and edges must be positioned appropriately within a recess in the substrate. As the SCD grows upward and horizontally the substrate recess must also be enlarged (both in depth and width) to maintain an appropriate spatial relationship between the substrate and the substrate holder. An appropriate spatial relationship between the top of the substrate surface and edges and the adjacent substrate holder interior surface and edges is achieved by maintaining the correct distance between the substrate and the substrate holder and the plasma. Accordingly, in an exemplary embodiment, the special relationship can be adjusted and controlled by: (1) maintaining diffusion/flows of plasma and the radical species onto the SCD surface; (2) shielding the SCD substrate from the hot plasma species and the impressed microwave electromagnetic fields; and (3) placing the substrate into an environment that is thermally uniform, i.e. the substrate surface, edges and the surrounding Mo holder surfaces and edges are at locally uniform temperatures, thereby creating conditions that are conducive for uniform SCD diamond synthesis over the entire substrate.

A process for growing diamond according to the present disclosure can be scaled up to multiple substrates using a 915 MHz reactor. Simultaneous deposition over many substrates was demonstrated by way of the following example.

Example II

Figure 28A:
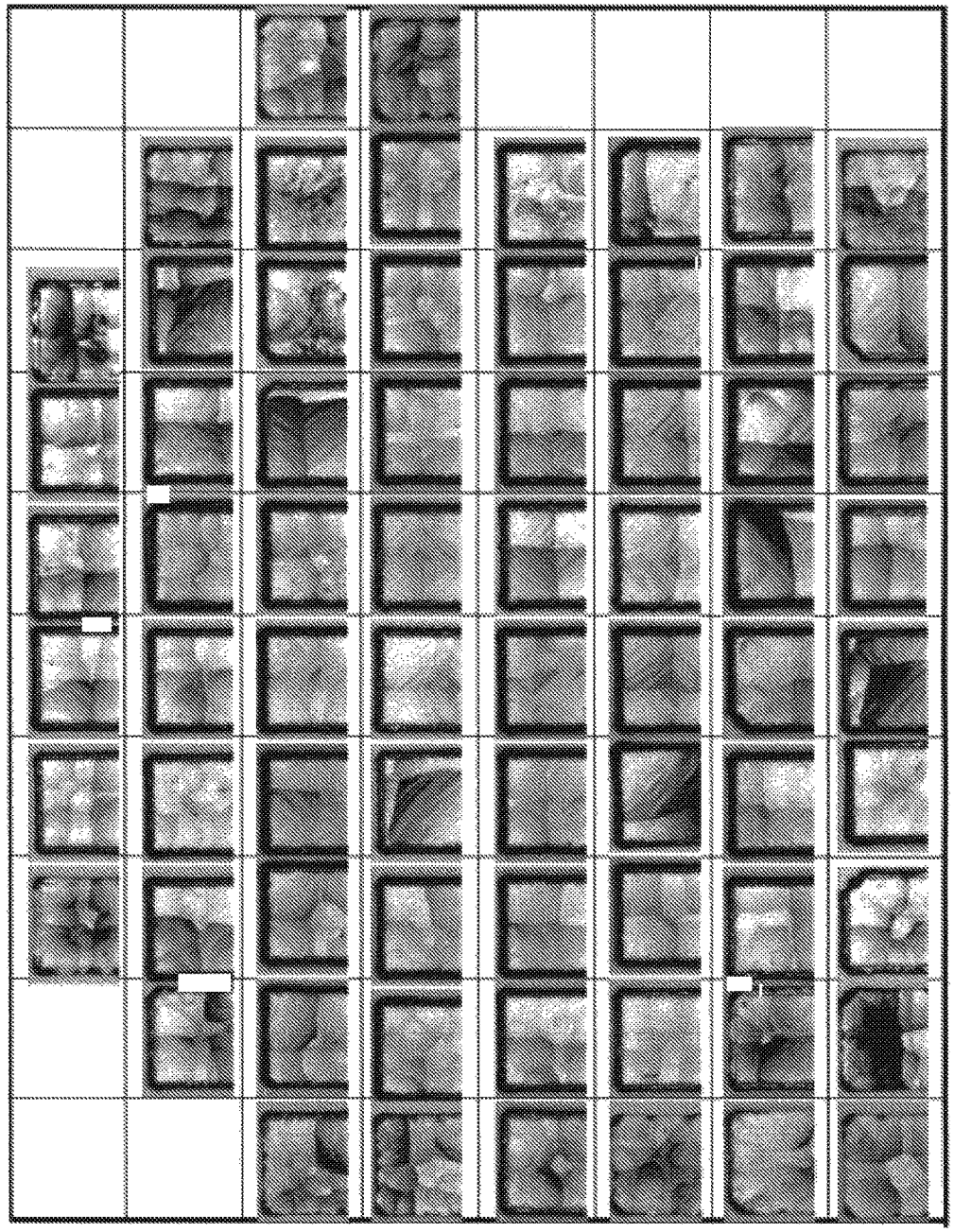
FIG. 28A shows photographs of a 70 seed growth run of 42 hours using an optical microscope on the top surfaces of the samples.
Figure 28B:
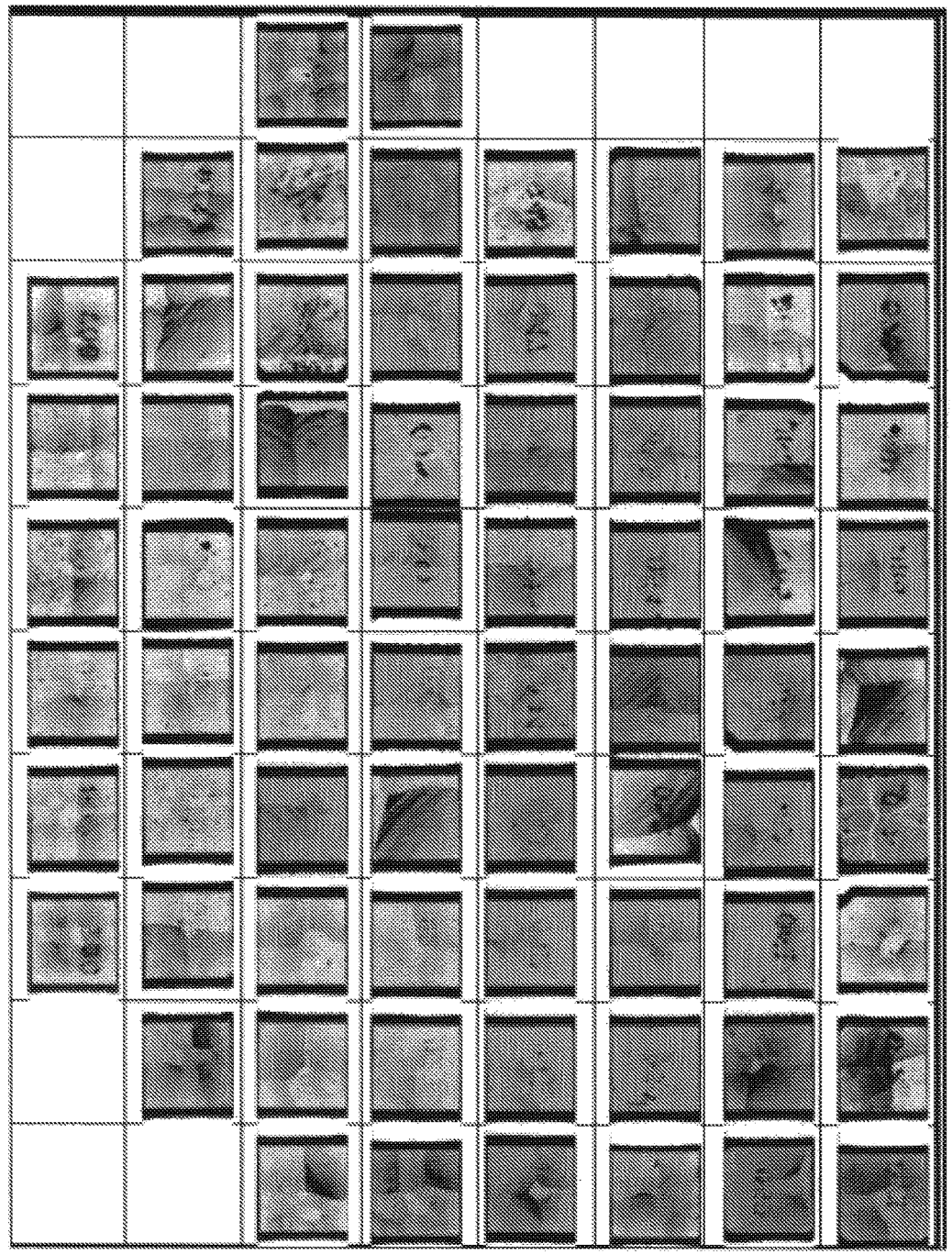
FIG. 28B shows photographs of the 70 seed growth run of 42 hours from FIG. 28A with a light delivered from the bottom of the substrates.

Synthesis over seventy substrates was achieved according to the process described herein. Referring to FIGS. 28A-28D, SCD was achieved for seventy seeds over a 42.5 hour run time. Only one deposition was studied for this example although additional depositions are possible by the process described hereinabove. The deposition took place over 38 hours. The difference in run time and deposition time is attributable to general preparation time and cleaning of sample, reactor chamber and associated components. After the 42.4 hour run, photos were taken via an optical microscope. FIG. 28A represents photos of top surfaces of each of the 70 samples. Light was delivered to the samples such that the optical microscope in the photos of FIG. 28A was focused on the top surfaces of the substrates having diamond deposited thereon. FIG. 28B illustrates the samples shown in FIG. 28A with the light being delivered from underneath the substrate. In this example, each sample typically expressed a generally yellow, brown or orange like color. The color is dependent upon the quantity of Nitrogen introduced into the deposition and is not necessarily a reflection of desired product, indeed this experiment was intended to illustrate the growth characteristics of Multi-Substrate deposition.

The SCD run was performed using a 915 MHz reactor under the following parameters: $H_2$ flow rate of 600 sccm; $CH_4$ flow rate of 42 sccm; $H_2/N_2$ mixture flow rate of 9 sccm (150 ppm of $N_2$); 125 Torr, and 11.5 kW. FIGS. 28C and 28D represents an array of numbers corresponding to each sample from FIGS. 28A and 28B. Each box shown in FIGS. 28C and 28D corresponds to the sample in the same relative position from the previous FIGS. 28A and 28B. Each box of FIGS. 28C and 28D show a top and bottom number. In both FIGS. 28C and 28D, the bottom number represents the linear growth rate of the corresponding substrate in microns/hour. The top number in FIG. 28C represents the total thickness achieved over the 38 hour deposition. The top number in FIG. 28D represents the deposition temperature measured at each sample. The temperature was intended to be maintained uniformly across all of the substrates.

Results from the experiment demonstrate relatively high quality SCD synthesis on each substrate with little or no polycrystalline rim formation. Spots in the center of the substrates may have originated from either the laser scribed number on the bottom surface (non deposited surface) or from the substrate surface after the initial etch step. FIG. 28D shows experimentally measured deposition temperatures and linear growth rates on each substrate respectively. The temperature distribution and the synthesis growth rates are relatively uniform over a 4-5 inch diameter deposition area. For example, the linear growth rates varied across the four and one half inch diameter substrate holder surface from about 14 microns/hr. to 20 microns/hr. Additional deposition process steps were performed with either silicon inserts placed under each substrate, or with additional frames added. These experiments resulted in the synthesis of high quality larger SCD substrates. In order to improve deposition uniformity individual substrate positions were moved around from run to run; i.e. individual substrates were moved from the center to the outer diameter position and vise versa as each new process step was carried out.

The present disclosure provides for a multi-substrate and multi-step CVD synthesis process that deposits a diamond atomic layer by layer onto a diamond substrate. As the substrate thickness increases the substrate gradually grows higher and also grows horizontally, and most importantly the substrate top surface grows upward and eventually extends deeper into the plasma. Since the edges of the substrate also grow horizontally, the substrate edges move closer to the substrate side wall within the recess. The growth then alters the substrate Mo holder geometry which in turn changes the substrate temperature, alters the gas flows around and onto the substrate and varies the radical species diffusing onto the substrate. As the substrate gradually becomes larger the substrate becomes thicker with a larger cross sectional surface area and then since the substrate holder geometry changes the experimental growth conditions are no longer appropriate (i.e. no longer within the "deposition window") for synthesis of high quality diamond. Thus the process is stopped and the reactor is opened and the substrate and Mo holders are unloaded. An additional frame is placed on top of the substrate holder and then growth is resumed. Then the deposition process is restarted. It is desirable to perform cleaning of the reactor chamber, holder, substrate and associated components according to the cleaning mechanisms described hereinabove.

In an exemplary embodiment, an additional frame is added defining a relatively larger recess or cavity and positioned above the first recess. A top surface of the additional frame is defined above the diamond substrate top surface and associated edges with respect (a) to the plasma and (b) to the substrate holder edges. This allows the substrate to be located in a suitable single crystal growth environment. Diamond synthesis continues until the substrate thickness increases such that it again protrudes from the holder and extends slightly into the microwave plasma. It is experimentally observed that as the substrate grows and moves into the discharge the deposition conditions change (for example substrate temperature and the number of deposition species that are impinging on the substrate are changed) and the resulting synthesized diamond properties are also changed; i.e. deposition conditions are no longer desirable. Accordingly, the process is stopped once the diamond has protruded above the top surface of the additional frame, another frame is added and the deposition process is resumed and carried out within the "deposition window". These steps can be repeated several times depending on the desired size of the final diamond substrate.

Example III

The present disclosure provides for a process for SCD synthesis using a movable stage. A multiple recess holder reactor configuration and the associated process consists of several start and stop process steps. However, it may be burdensome to start and stop the process many times, since it adds to the total process time and adds handling and other process complexities to the complete process. For example, special substrate handling concerns must be taken between runs to minimize process contamination. Thus it is desirable to employ a method of continuously adjusting the substrate position in situ and there by keeping the deposition conditions on the substrate within the experimental variable window that enables optimum, high quality, new diamond synthesis. In an exemplary embodiment, the present disclosure provides for a reactor with a movable stage operable to reduce process steps and thus simplifying the entire process.

In an exemplary movable stage substrate holder configuration, a basic applicator design is used that is similar to the basic microwave cavity plasma reactor design with an alteration to allow the substrate holder/cooling stage to be varied axially as diamond synthesis proceeds. In an exemplary embodiment, the axial position variation is relatively small, typically about 2-10 mm. The movable substrate cooling stage allows the substrate to be repositioned during growth and thus the substrate position with respect to the discharge and the Mo holder walls can be continuously adjusted during the diamond growth process. This repositioning allows the substrate top surface and the associated edges to be adjusted to be in a desired location to keep deposition variables within a desired deposition window.

Figure 27:
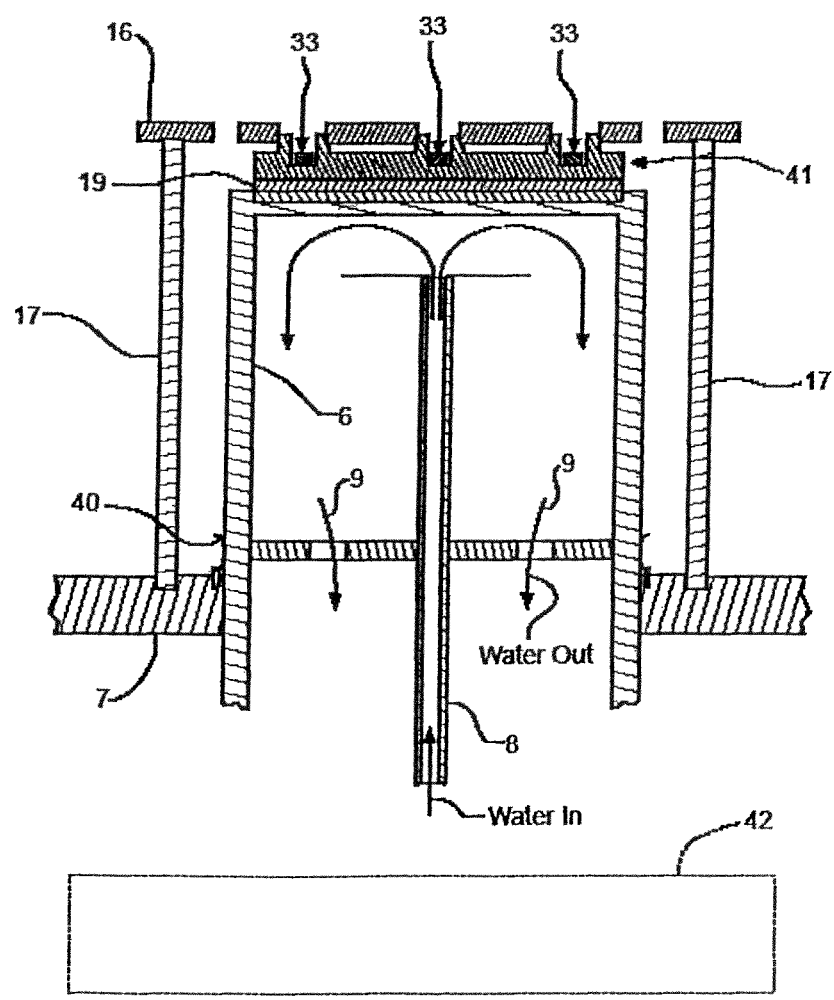
FIG. 27 illustrates an exemplary movable stage embodiment of a holder and reactor configuration for multiple SCD growth.

In an exemplary embodiment, addition of a movable stage modifies the basic reactor design by changing the substrate holder/cooling stage configuration. The modified substrate holder configuration with a movable cooling stage is shown in FIG. 27. According to FIG. 27, a movable stage reactor comprises: (a) a water cooled stage 6, 8 and 9; (b) a fixed bottom base plate (7); (c) a quartz tube 17; (d) a Mo insulation disk set 19; (e) one or more single crystal substrates 33; (f) sliding microwave "finger stock" contacts 40; (g) a Mo flow pattern regulator 16 and substrate frame; and (h) a top Mo disk set piece 41 with substrate holder wells to fix the locations of the diamond substrates. The fixed bottom plate, the quartz tube, the single crystal substrates, and the Mo insulation disks have the same roles as in the fixed substrate holder configurations described in 1.0 and 2.0. The cooling stage assembly is modified so that it can move several millimeters up and down axially. This motion can be controlled by the linear motion of a support rod 42 through a vacuum feed-through or by the linear motion a fixed length shaft surrounded length adjustable cylindrical bellow wall assembly.

In an exemplary embodiment, the sliding finger stock contacts 40 allow the cooling stage to move axially without breaking the electrical microwave contact. Deposition holes are added to the flow pattern regulator 16 to provide the diamond substrates open access to the plasma radical species. The top Mo disk piece 41 is similar to the substrate holder disk piece, i.e. it positions the substrates into precisely located recess holes. It can also be modified as shown in FIG. 27 to allow a sliding, telescoping Mo contact with the Mo flow pattern regulator. The dimensions of the adjustable substrate deposition aperture are adjusted empirically to provide high quality diamond synthesis.

During each experimental run each substrate temperature is continuously monitored via a pyrometer measurement, and all substrates are visually inspected by the operator during the experimental run. Then as the diamond grows the stage is adjusted (moved up or down) manually or by computer control to adjust the substrate growth environment to be located within the appropriate deposition window.

Example IV

Figure 25:
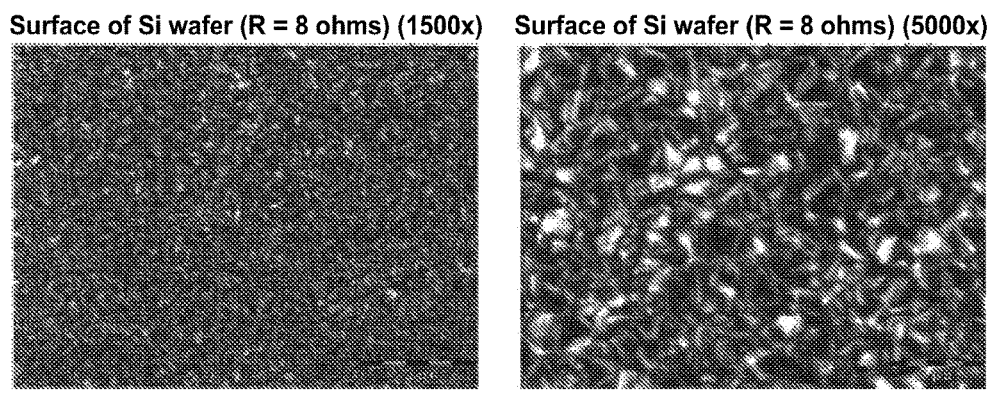
FIG. 25 illustrates a surface of Si wafer (R=8 ohms) (1500×) and surface of Si wafer (R=8 ohms) (5000×)
Figure 26:
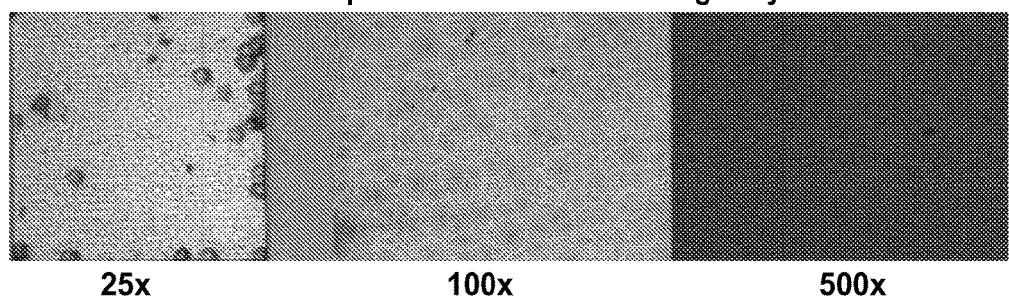
FIG. 26 illustrates boron-doped diamond coated on single crystal substrate.

In an exemplary embodiment, the present disclosure provides for deposition of thick boron-doped homoepitaxial single crystal diamond by microwave plasma chemical vapor deposition. Deposition of boron-doped homoepitaxial single crystal diamond can be accomplished using a microwave plasma-assisted chemical vapor deposition system. Experiments were performed to investigate capabilities of depositing high-quality boron-doped single crystal diamond and establish relationships between deposition conditions and diamond growth rate, quality and electrical conductivity. Studies were done growing 25 μm thick B-doped layers, with boron content varying from 0.02 ppm to 20 ppm in the pressure range of 135-140 Torr. (See e.g., E. Bustarret, E. Gheeraert, K. Watanabe, *Phys. Stat. Sol.* (a) 199 (1) (2003) 9.) Previous experiments have grown boron doped diamond using diborane levels of 5-50 ppm diborane in a feedgas of hydrogen and methane (4-6%). (R. Ramamurti, M. Becker, T. Schuelke, T. Grotjohn, D. Reinhard, G. Swain, and J. Asmussen, *"Boron doped diamond deposited by microwave plasma-assisted CVD at low and high pressures"*, Diamond and Related Materials, 17, 481-485, 2008, and R. Ramamurti, T. A. Grotjohn, D. K. Reinhard and J. Asmussen, *"Synthesis of boron-doped homoepitaxial single crystal diamond by microwave plasma chemical vapor deposition,"* Diamond and Related Materials, 17, 1320-1323, 2008.) Accordingly, in an exemplary embodiment, boron can be incorporated substitutionally and B/C concentration measures in the diamond layer from 80 to 700 ppm for feedgas ratios in the plasma discharge of 5 to 50 ppm diborane, respectively. The experimental conditions utilized included pressures of 140-160 Torr and substrate temperatures of 900-1200° C. The room temperature electrical conductivity for the diamond deposited under these conditions ranged from 0.1 to 30 $(ohm-cm)^{-1}$. Diamond was deposited with growth rates of 2 to 11 μm/hr. Boron doped films grown on Silicon wafers are shown in FIG. 25. In an exemplary embodiment, a single crystal seed holder and seeds were mounted in a diborane system and coated with single crystal diamond as illustrated with respect to FIG. 26.

It was observed that incorporation of higher amounts of boron in diamond deposition leads to a degradation of crystalline quality (See e.g., Bustarret, E. Gheeraert, K. Watanabe, *Phys. Stat. Sol.* (a) 199 (1) (2003) 9; Teraji, H. Wada, M. Yamamoto, K. Arima, and T. Ito, *Diamond Relat. Mater.* 15 (2006) 602.) Hence, doping with low boron content is needed for some boron doped diamond applications. As such, this study examined using boron content in the feedgas at concentrations of 10 ppm or less.

Figure 29:
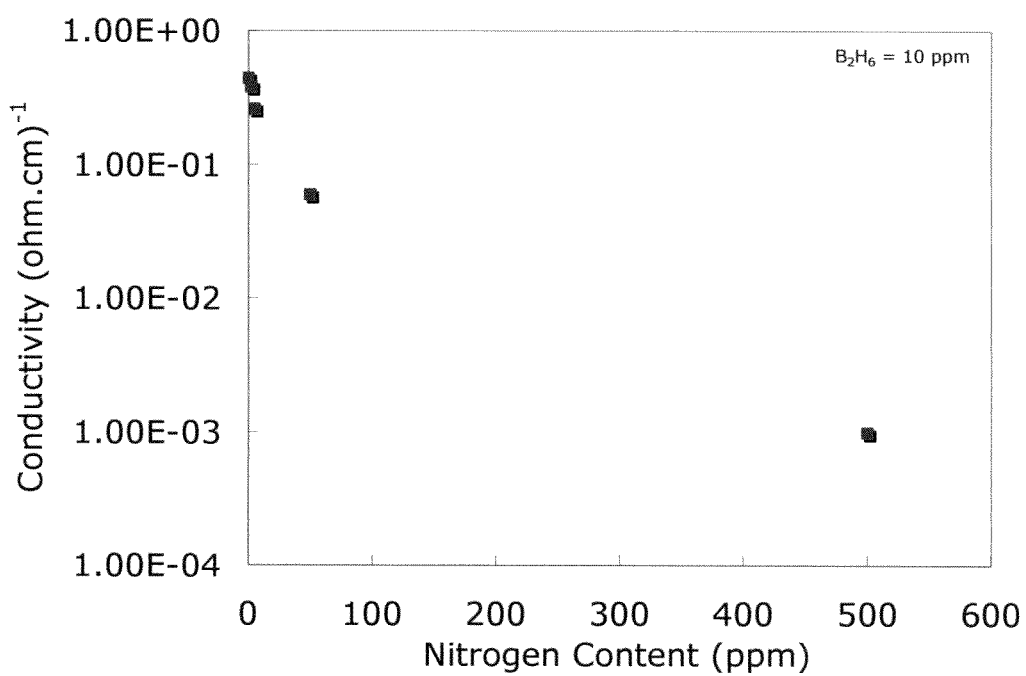
FIG. 29 shows variation of room temperature electrical conductivity of boron-doped single crystal diamond layers with nitrogen content in a plasma feed gas.

A particular objective was to alter the critical deposition parameters developed for deposition with high boron concentrations of 5-50 ppm in order to grow high quality boron doped SCD layers up to 2000 μm thick with lower boron content (10 ppm or less in the feedgas). In an exemplary embodiment, in order to grow such layers with minimum defects parameters such as methane concentration, substrate temperature and concentration of nitrogen in the feedgas were adjusted, observed and controlled to a suitable extent. For example, the effect of nitrogen in the feedgas on the electrical properties of the B-doped diamond layers was measured and the results are shown in FIG. 29. Specifically, FIG. 29 shows the variation of electrical conductivity with nitrogen content in the plasma. Type Ib HPHT diamond seeds as substrates were used to study growing diamond with varying amounts of diborane in a methane-hydrogen gas mixture. The deposition system utilized a 2.45 GHz microwave plasma-assisted CVD system operating at 140-160 Torr, 2-3 kW, 4-6% methane, 1-10 ppm diborane in the feedgas, and 0-500 ppm nitrogen in the feedgas. As one example, a low defect boron doped SCD layer 2000 μm thick was realized with 1 ppm diborane and 0 ppm nitrogen.

Example V

Thermal management of the process is desirable to achieve suitable substrate growth. In an exemplary embodiment, the process is thermally managed by appropriate design/adjustment of the molybdenum substrate holder. Local thermal management can be characterized as controlling the local environment of the substrate for an individual substrate or the local environment of each substrate for multiple substrate deposition. Macroscopic thermal management is typically related to managing environment and species characteristics by maintaining uniformity across a substrate holder and the growth volume space (i.e., reactor cavity). Macroscopic thermal management is utilized to create a uniform deposition environment over an entire deposition area covering all of the substrates. The local substrate area may involve areas of less than 1-2 cm2 while multiple substrate deposition may involve larger areas that may range from 10 cm2 to areas greater than 100 cm2. The local environment is controlled by adjusting the local deposition volume space while the process uniformity of the larger deposition area is controlled by adjusting the plasma position, plasma size/volume and the substrate holder set geometry.

In a particular embodiment, the substrate holder can be designed and adjusted to express a desired temperature adjustment or profile across the entire substrate. Molybdenum plates can be stacked one upon the other forming a multilayer stack of relatively thin molybdenum plates. The thin plates are then placed directly on a water cooling stage for desired thermal control. Thus, the temperature of the substrate can be adjusted to be within a desired temperature profile range for a given operating pressure by adding or subtracting molybdenum plates. (See e.g., FIG. 7.) Accordingly, if the pressure is increased, for example from 140 to 180 Torr, the discharge gas temperature will increase and thus the substrate should be cooled more in order to keep the substrate within the deposition range. This additional cooling is achieved by removing one or more of the molybdenum plates. If the pressure is decreased from 140 Torr to 100 Torr then one or more molybdenum plates can be added to adjust the substrate temperature to be within the deposition range.

In a further embodiment, local substrate temperature can be adjusted by varying the operating pressure. Substrate temperature is measured on the substrate surface or the diamond seed/chip surface growing into the plasma. If the pressure is adjusted, then the input power and possibly the cavity tuning may also be adjusted to ensure that the plasma discharge is in contact with and covers the substrates. Temperature can further be adjusted while operating at a constant pressure by adjusting the sliding short or by varying the input power. Substrate temperature, input power, plasma size, and pressure are nonlinearly related—i.e. a change in one variable results in variation of the others. In a multiple substrate embodiment, substrate temperature can be adjusted by placing an insert directly underneath each substrate thereby effectively adjusting the relative height of each substrate. Exemplary inserts can be made from molybdenum, silicon and characterized as insert wafers or shims. The present disclosure provides for a multiple diamond deposition process operable to grow diamond in an environment of temperature uniformity. By maintaining the substrate within the growth volume space and thus within deposition volume space, the substrate temperature remains relatively uniform thus avoiding thermal runaway on the substrate edges. In a further embodiment, the diamond substrate chip can be physically clamped or brazed to the cooling stage or molybdenum holder to further manage and control the thermal parameters of each substrate.

In an exemplary embodiment, it is desirable for the microwave discharge to hover over and be in contact with each substrate. The positioning (or moving) of the discharge is done by varying the axial position of the (1) substrate holder configuration, and/or (2) the sliding short. For a single SCD substrate deposition, input power is adjusted to produce a discharge size that entirely covers the substrate producing a thermally and reactive species deposition environment over the entire single substrate. This provides for uniform deposition over the substrate. In a multiple substrate embodiment, the discharge must be increased to create a relatively larger area, positioned such that thermally homogeneous discharge is achievable to uniformly cover each substrate. The input microwave power can be increased to cover each substrate. Thus deposition over one substrate requires much less input power than the power required for a multiple substrate deposition process. However the input gas mixtures and substrate temperatures are similar.

While the present invention is described herein with reference to illustrated embodiments, it should be understood that the invention is not limited hereto. Those having ordinary skill in the art and access to the teachings herein will recognize additional modifications and embodiments within the scope thereof. Accordingly, such modifications and/or embodiments are considered to be included within the scope of the present invention.

What is claimed:

1. A microwave cavity plasma reactor (MCPR) for growing diamond, the reactor comprising:
   (a) a substrate holder for holding a growth substrate and growing diamond, the substrate holder comprising a bottom surface, a top surface opposing the bottom surface in a longitudinal axis direction defined by the substrate holder, a base surface between the top surface and bottom surface, and one or more sidewalls extending between the base surface and the top surface, wherein:
      (i) the one or more sidewalls and the base surface define a cavity in the substrate holder, the cavity having a depth in the longitudinal axis direction extending between the base surface and the top surface,
      (ii) the cavity comprises a first recess in a lower portion of the cavity and a second recess in an upper portion of the cavity,
      (iii) the first recess is adjacent the base surface, and
      (iv) the second recess is directly above the first recess and extends a predetermined distance above the first recess to define a growth volume space in the cavity;
   (b) a reactor chamber enclosing the substrate holder, the reactor chamber being coupled to a microwave delivery means and a fluid inlet stream for generating a plasma in the reactor chamber;
   (c) a quartz dome enclosing the substrate holder, the quartz dome being positioned for facilitating formation of a plasma discharge over a substrate when the substrate is present in the substrate holder;
   (d) a recess extending means for extending the distance of the second recess above the first recess along the longitudinal axis thereby increasing the growth volume space as the substrate grows in thickness during diamond growth;
   wherein the reactor is operable to grow diamond on the substrate as a first thickness and a second thickness by contacting the substrate with the plasma in the growth volume space.

2. The reactor of claim 1, wherein the substrate holder is fabricated from molybdenum.

3. The reactor of claim 1, wherein the second recess has a larger cross sectional area than that of the first recess taken perpendicular to the longitudinal axis.

4. The reactor of claim 1, further comprising a substrate present in the first recess of the cavity in the substrate holder, wherein the substrate is a diamond chip and the diamond growth is characterized as single crystal diamond (SCD).

5. The reactor of claim 1, wherein the microwave delivery means is adapted to deliver microwaves at a frequency selected from the group consisting of 2.45 GHz and 915 MHz.

6. The reactor of claim 1, wherein the substrate holder comprises a plurality of separate and spaced apart cavities, wherein:
   (i) each cavity is defined by one or more sidewalls and a base surface of the substrate holder,
   (ii) each cavity comprises a first recess in a lower portion of the cavity and a second recess in an upper portion of the cavity, and
   (iii) each cavity is adapted to hold a substrate for simultaneous multiple diamond growth.

7. The reactor of claim 6, wherein the reactor is operable to grow diamond on each substrate present in the plurality of cavities.

8. The reactor of claim 1, further comprising a cooling stage for maintaining the substrate holder at a predetermined temperature.

9. The reactor of claim 8, wherein the predetermined temperature is between 850 and 1300° C.

10. The reactor of claim 1, wherein the recess extending means is a movable stage adapted to increase the growth volume space during reactor operation and diamond deposition.

11. The reactor of claim 1, wherein the cavity has a square cross-sectional geometry in the longitudinal axis direction.

* * * * *